United States Patent
Kouchi et al.

(10) Patent No.: US 10,383,215 B2
(45) Date of Patent: Aug. 13, 2019

(54) RADIO-FREQUENCY PRINTED CIRCUIT BOARD AND WIRING MATERIAL

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Masahiko Kouchi, Shiga (JP); Kazuo Murata, Shiga (JP); Makoto Nakabayashi, Osaka (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 816 days.

(21) Appl. No.: 14/890,497

(22) PCT Filed: Jan. 16, 2014

(86) PCT No.: PCT/JP2014/050643
§ 371 (c)(1),
(2) Date: Nov. 11, 2015

(87) PCT Pub. No.: WO2014/192322
PCT Pub. Date: Dec. 4, 2014

(65) Prior Publication Data
US 2016/0113109 A1    Apr. 21, 2016

(30) Foreign Application Priority Data

May 31, 2013  (JP) ................. 2013-116498
May 31, 2013  (JP) ................. 2013-116499
Jun. 28, 2013  (JP) ................. 2013-137511

(51) Int. Cl.
*H01K 1/02*     (2006.01)
*H05K 1/02*     (2006.01)
(Continued)

(52) U.S. Cl.
CPC ............ *H05K 1/0271* (2013.01); *B32B 7/10* (2013.01); *B32B 15/08* (2013.01); *H05K 1/034* (2013.01);
(Continued)

(58) Field of Classification Search
CPC ...... H05K 1/0271; H05K 1/036; H05K 1/056; H05K 1/024; B23B 7/10
See application file for complete search history.

(56) References Cited

U.S. PATENT DOCUMENTS

| 6,417,459 B1 * | 7/2002 | Kanzaki ................. 174/250 |
| 2003/0029830 A1 * | 2/2003 | Takaya ........... H01F 17/0006 216/13 |

(Continued)

FOREIGN PATENT DOCUMENTS

| JP | H05-69442 A | 3/1993 |
| JP | H05-269918 A | 10/1993 |

(Continued)

OTHER PUBLICATIONS

Wallengerger, Glass Fibers, ASM Handbook, vol. 21, p. 27-34 (2001) (Year: 2001).*

*Primary Examiner* — Kara B Boyle
(74) *Attorney, Agent, or Firm* — Drinker Biddle & Reath LLP

(57) ABSTRACT

(1) A conductor layer is disposed on at least one surface of a dielectric layer, the dielectric layer including an intermediate layer and a pair or more of fluororesin layers disposed on both surfaces of the intermediate layer, in which the ratio (Continued)

of the total average thickness of the intermediate layer to the total average thickness of the fluororesin layers is 0.001 to 30, the relative dielectric constant of the intermediate layer is 1.2 to 10, the coefficient of linear expansion of the intermediate layer is $-1\times10^{-4}/°$ C. to $5\times10^{-5}/°$ C., and the adhesive strength between the fluororesin layer and the conductor layer is 300 g/cm or more. (2) Conductor layers are disposed on both surfaces of a dielectric layer made of a fluororesin, in which at least one of the conductor layers constitutes a wiring pattern, the average trace width of the wiring pattern is 25 to 300 μm, the average thickness of the dielectric layer in the region where traces of the wiring pattern are disposed is 5 to 125 μm, and the ratio of the average trace width to the average thickness of the dielectric layer is 2.4 to 30. (3) A multilayer structure includes conductor layers and dielectric layers made of a fluororesin alternately disposed, in which the fluororesin of the dielectric layers is crosslinked and chemically bonded to the conductor layers, the average thickness of the multilayer structure is 30 to 2,000 μm, and the crush resistance of the multilayer structure measured by a loop stiffness test is 0.1 to 20,000 N/cm.

8 Claims, 6 Drawing Sheets

(51) Int. Cl.
  *B32B 15/08* (2006.01)
  *H05K 1/03* (2006.01)
  *H05K 1/05* (2006.01)
  *B32B 7/10* (2006.01)
(52) U.S. Cl.
  CPC ............ *H05K 1/036* (2013.01); *H05K 1/056* (2013.01); *B32B 2307/202* (2013.01); *B32B 2307/204* (2013.01); *B32B 2457/08* (2013.01); *H05K 1/024* (2013.01); *H05K 2201/015* (2013.01); *H05K 2201/0195* (2013.01)

(56) References Cited

U.S. PATENT DOCUMENTS

| | | | |
|---|---|---|---|
| 2005/0019599 A1* | 1/2005 | Moteki | C25D 1/04 428/626 |
| 2006/0218785 A1* | 10/2006 | Horiuchi | H04R 19/016 29/886 |
| 2011/0127074 A1* | 6/2011 | Takahashi | C25D 3/38 174/257 |

FOREIGN PATENT DOCUMENTS

| | | |
|---|---|---|
| JP | H05-291711 A | 11/1993 |
| JP | H06-344503 A | 12/1994 |
| JP | H08-18403 B2 | 2/1996 |
| JP | H08-041362 A | 2/1996 |
| JP | 2001-007466 A | 1/2001 |
| JP | 2003-171480 A | 6/2003 |
| JP | 2004-025835 A | 1/2004 |
| JP | 2006-024618 A | 1/2006 |
| JP | 4296250 B2 | 7/2009 |
| WO | WO-2009/147956 A1 | 12/2009 |
| WO | WO-2012/161162 A1 | 11/2012 |

\* cited by examiner (A)

(B)

(A)

(B)

(C)

(D)

(A)

(B)

RADIO-FREQUENCY PRINTED CIRCUIT BOARD AND WIRING MATERIAL

TECHNICAL FIELD

The present invention relates to a radio-frequency printed circuit board and a wiring material.

BACKGROUND ART

In recent years, data communication traffic has steadily been increasing, and in response to this, for example, in devices, such as IC cards and mobile phone units, communications in the radio-frequency range, such as the microwave range or the millimeter wave range, have become widely used. Accordingly, there has been a demand for a radio-frequency printed circuit board which has a small transmission loss when used in the radio-frequency range.

In a commonly used printed circuit board, the transmission rate V and the transmission loss αd satisfy the relationships (expressions (1) and (2)) below, where εr is the relative dielectric constant of the dielectric layer, f is the frequency, and tan δ is the dielectric loss tangent.

[Expression 1]
$$V \propto \frac{1}{\sqrt{\varepsilon r}} \quad (1)$$

[Expression 2]
$$\alpha d \propto f \times \sqrt{\varepsilon r} \times \tan\delta \quad (2)$$

That is, in order to increase the transmission rate V and decrease the transmission loss αd, it is required to decrease the relative dielectric constant εr of the dielectric layer. Therefore, it has been proposed to use, as the material for dielectric layers, fluororesins, such as polytetrafluoroethylene (PTFE), a tetrafluoroethylene-perfluoroalkyl vinyl ether copolymer (PFA), a tetrafluoroethylene-hexafluoropropylene copolymer (FEP), an ethylene-tetrafluoroethylene copolymer (ETFE), and polyvinylidene fluoride (PVdF), (for example, refer to Japanese Unexamined Patent Application Publication No. 2001-7466 and Japanese Patent No. 4296250).

CITATION LIST

Patent Literature

PTL 1: Japanese Unexamined Patent Application Publication No. 2001-7466
PTL 2: Japanese Patent No. 4296250

SUMMARY OF INVENTION

Technical Problem

However, the coefficient of thermal expansion ($9 \times 10^{-5}$/K) of the fluororesin constituting the dielectric layer is largely different from the coefficient of thermal expansion ($1.7 \times 10^{-5}$/K) of the metal (e.g., copper) constituting the conductor layer. Therefore, in the case where the dielectric layer and the conductor layer are directly stacked on each other, warpage may occur in reflow soldering which is performed at about 260° C., and if the warpage remains, it is likely that use as a radio-frequency printed circuit board will be difficult.

Furthermore, since the fluororesin has a markedly low level of surface energy, the adhesive strength between the conductor layer and the dielectric layer is insufficient, and in the case of use as a radio-frequency printed circuit board, the conductor layer and the dielectric layer are likely to be peeled off from each other during use. In order to overcome the problem of such peel-off, it is conceivable that, by placing a primer or an adhesive between the conductor layer and the dielectric layer, adhesive strength is increased. However, since the primer or the adhesive generally has a higher relative dielectric constant and a larger dielectric loss tangent than the dielectric layer, there is concern that the transmission rate may be decreased and the transmission loss may be increased.

Furthermore, in order to overcome the problem of peel-off, it is conceivable to roughen the surface of the conductor layer in advance by etching or the like. However, there is concern that this may cause a decrease in the transmission rate and an increase in the transmission loss. That is, in the radio-frequency range, since the skin effect makes current flow in the surface area of a conductor, when the surface of the conductor layer is roughened, the propagation distance increases, and transmission delay occurs. Furthermore, the transmission loss is likely to increase owing to attenuation by resistance or the like.

Furthermore, in the existing printed circuit board according to any of the patent publications described above, it is not possible to decrease the transmission loss sufficiently in the radio-frequency range. In particular, in a configuration in which a pair of conductor layers are disposed on both surfaces of a dielectric layer, and one of the conductor layers constitutes wiring, when the trace width of the wiring is increased, the dielectric loss tangent tan δ increases, resulting in an increase in transmission loss, which is disadvantageous. Accordingly, in the existing printed circuit board, it is necessary to form narrow traces. However, in narrow traces, since the allowable range of formation error is small, there is a difficulty in forming wiring, which may lead to an increase in manufacturing costs. Alternatively, in the existing printed circuit board, by increasing the thickness of the dielectric layer, the dielectric loss tangent tan δ is decreased and the transmission loss is decreased so that the printed circuit board can be used in the radio-frequency range. However, if the thickness of the dielectric layer is increased, the flexibility of the printed circuit board itself will become insufficient, and thus it will be difficult to use the printed circuit board as a flexible printed circuit board.

The present invention has been achieved under these circumstances, and it is an object of a first invention of the present application to provide a radio-frequency printed circuit board in which occurrence of warpage due to heating is sufficiently suppressed, and the transmission delay and the transmission loss are decreased. The invention can also be applied to a wiring material, such as a radio-frequency flat cable, a radio-frequency wire, or an antenna, having the same structure which includes a dielectric and a conductor. Furthermore, it is an object of a second invention of the present application to provide a radio-frequency printed circuit board in which the transmission loss is sufficiently small even in the radio-frequency range, and wiring can be formed easily and reliably. Furthermore, it is an object of a third invention of the present application to provide a radio-frequency printed circuit board which has excellent adhesion between a conductor layer and a dielectric layer while exhibiting high flexibility and which can be particularly suitably used for a flexible printed circuit board.

Solution to Problem

According to a first invention of the present application which has been achieved in order to solve the problem described above, a radio-frequency printed circuit board includes a dielectric layer and a conductor layer disposed on at least one surface of the dielectric layer, the dielectric layer including at least an intermediate layer and a pair of fluororesin layers disposed on both surfaces of the intermediate layer, in which the ratio of the total average thickness of the intermediate layer to the total average thickness of the pair of fluororesin layers is 0.001 to 30, the relative dielectric constant of the intermediate layer is 1.2 to 10, the coefficient of linear expansion of the intermediate layer is $-1 \times 10^{-4}/°$ C. to $5 \times 10^{-5}/°$ C., and the adhesive strength between the fluororesin layer and the conductor layer is 300 g/cm or more.

In the radio-frequency printed circuit board, the dielectric layer includes a pair of fluororesin layers and the intermediate layer having a relative dielectric constant in a certain range, and the ratio of the total average thickness of the intermediate layer to the total average thickness of the pair of the fluororesin layers is in the range described above. Therefore, the dielectric layer as a whole can achieve desired electrical performance, and thus it is possible to improve the transmission rate and to suppress the transmission loss. Moreover, since the coefficient of thermal expansion of the intermediate layer is in the range described above, in the case where the radio-frequency printed circuit board is heated, thermal expansion of the dielectric layer as a whole can be suppressed by the intermediate layer. Therefore, occurrence of warpage due to heating can be suppressed. Furthermore, in the radio-frequency printed circuit board, the adhesive strength between the fluororesin layer and the conductor layer is in the range described above, and adhesion between the two is improved. Therefore, for example, the peel-off between the dielectric layer and the conductor layer is unlikely to occur during circuit formation, and thus a decrease in the transmission rate or an increase in the resistance to transmission due to the peel-off between the dielectric layer and the conductor layer is unlikely to be caused.

The ten-point average roughness (Rz) of the conductor layer is preferably 4.0 µm or less, and particularly preferably 2.0 µm or less. In this case, even if current flows in the surface area of the conductor owing to the skin effect, the propagation distance is unlikely to be increased, and it is possible to obtain a suitable transmission rate and transmission loss.

Preferably, the fluororesin layer and the conductor layer are chemically bonded to each other. In this case, the fluororesin layer and the conductor layer can be easily and reliably bonded to each other with a desired adhesive strength.

The adhesive strength between the fluororesin layer and the conductor layer is preferably 600 g/cm or more. In this case, since the adhesion between the conductor layer and the fluororesin layer is further improved, it is possible to effectively suppress a decrease in the transmission rate or an increase in the resistance to transmission due to the peel-off between the dielectric layer and the conductor layer.

Preferably, the fluororesin layer is chemically bonded to the intermediate layer. In this case, since the adhesion between the fluororesin layer and the intermediate layer is improved, the peel-off between the fluororesin layer and the intermediate layer is unlikely to occur.

The apparent relative dielectric constant of the dielectric layer is preferably 1.2 to 2.6. In this case, the dielectric layer as a whole can achieve desired electrical performance easily and reliably.

Preferably, a rustproofing layer containing a silane coupling agent is disposed on the conductor layer at the interface between the conductor layer and the dielectric layer, and the silane coupling agent and the fluororesin are chemically bonded to each other. Thereby, the dielectric layer and the conductor layer can be easily and reliably bonded to each other with a desired adhesive strength.

An empty space or a foamed layer may be provided, at least one of, in the fluororesin layer or the intermediate layer of the dielectric layer, at the interface between the conductor layer and the dielectric layer, and at the interface between the fluororesin layer and the intermediate layer of the dielectric layer. When an empty space or a foamed layer is present as described above, it is possible to decrease the overall dielectric constant.

The chemical bonding between the fluororesin layer and the conductor layer may be induced by irradiation with ionizing radiation. That is, although it is also possible to induce chemical bonding between the fluororesin layer and the conductor layer using a thermal radical reaction in a vacuum, by inducing chemical bonding by irradiation with ionizing radiation, the reaction is accelerated, which is preferable. Thus, it is possible to improve the adhesive strength (to produce chemical bonding) between the fluororesin layer and the conductor layer easily and reliably by irradiation with ionizing radiation.

The fluororesin may be crosslinked. By crosslinking the fluororesin, it is possible to suppress deformation at the reflow soldering temperature (about 260° C.). Furthermore, preferably, the fluororesin is crosslinked by irradiation with ionizing radiation because crosslinking is accelerated.

According to another invention which has been achieved in order to solve the problem described above, a wiring material includes a dielectric layer and a conductor layer disposed on at least one surface of the dielectric layer, the dielectric layer including at least an intermediate layer and a pair of fluororesin layers disposed on both surfaces of the intermediate layer, in which the ratio of the total average thickness of the intermediate layer to the total average thickness of the pair of the fluororesin layers is 0.001 to 30, the relative dielectric constant of the intermediate layer is 1.2 to 10, the coefficient of linear expansion of the intermediate layer is $-1 \times 10^{-4}/°$ C. to $5 \times 10^{-5}/°$ C., and the adhesive strength between the fluororesin layer and the conductor layer is 300 g/cm or more.

In the wiring material, the dielectric layer includes a pair of fluororesin layers and the intermediate layer having a relative dielectric constant in a certain range, and the ratio of the total average thickness of the intermediate layer to the total average thickness of the pair of the fluororesin layers is in the range described above. Therefore, the dielectric layer as a whole can achieve desired electrical performance, and thus it is possible to improve the transmission rate and to suppress the transmission loss. Moreover, since the coefficient of thermal expansion of the intermediate layer is in the range described above, in the case where the wiring material is heated, thermal expansion of the dielectric layer as a whole can be suppressed by the intermediate layer. Therefore, occurrence of warpage due to heating can be suppressed. Furthermore, in the wiring material, the adhesive strength between the fluororesin layer and the conductor layer is in the range described above, and adhesion between the two is improved. Therefore, the peel-off between the dielectric layer and the conductor layer is unlikely to occur, and thus a decrease in the transmission rate or an increase in the resistance to transmission due to the peel-off between the dielectric layer and the conductor layer is unlikely to be caused.

Here, the term "coefficient of linear expansion" refers to the rate at which the length of an object expands for a rise in temperature of 1° C., which is an average value in the temperature range of 20° C. to 150° C. and can be measured by a thermal mechanical analyzer (TMA) or the like. The term "adhesive strength" means the peel strength measured in accordance with JIS C6481. The "ten-point average roughness (Rz)" is a value measured in accordance with JIS B 0601-1994, in which the evaluation length (l) is set at 3.2 mm, and the cutoff value ($\lambda c$) is set at 0.8 mm. The term "apparent relative dielectric constant of the dielectric layer" means the ratio of the total dielectric constant to the dielectric constant in vacuum when the dielectric layer is considered as a medium.

According to a second invention of the present application which has been achieved in order to solve the problem described above, a radio-frequency printed circuit board includes a dielectric layer made of a fluororesin and a pair of conductor layers disposed on both surfaces of the dielectric layer, in which at least one of the pair of conductor layers constitutes a wiring pattern, the average trace width of the wiring pattern is 25 to 300 µm, the average thickness of the dielectric layer in the region where traces of the wiring pattern are disposed is 5 to 125 µm, and the ratio of the average trace width to the average thickness of the dielectric layer is 2.4 to 30.

In the radio-frequency printed circuit board, since the average trace width is in the range described above, the allowable range of formation error for wiring can be set to be large, and thus formation of wiring can be performed easily and reliably. Furthermore, in the radio-frequency printed circuit board, by setting the thickness of the dielectric and the ratio of the average trace width to the thickness of the dielectric to be in the ranges described above, despite the average trace width being in the range described above, the dielectric loss tangent can be sufficiently decreased, and the transmission loss can be sufficiently decreased even in the radio-frequency range.

In the radio-frequency printed circuit board, the transmission loss of the wiring pattern is preferably 0.23 dB/cm or less at a frequency of 10 GHz. In this case, the printed circuit board can be suitably used for transmission in the radio-frequency range.

The ten-point average roughness (Rz) of the conductor layer is preferably 4.0 µm or less, and particularly preferably 2.0 µm or less from the viewpoint of the skin effect. In this case, the transmission loss can be sufficiently decreased, and the transmission rate can be sufficiently increased. That is, in the radio-frequency range, since the skin effect makes current flow in the surface area of a conductor, when the ten-point average roughness (Rz) is large, the propagation distance increases, and transmission delay occurs. Furthermore, there is a possibility that the transmission loss will be increased owing to attenuation by resistance or the like. In contrast, by setting the ten-point average roughness (Rz) in the range described above, it is possible to obtain a suitable transmission rate and transmission loss.

In the radio-frequency printed circuit board, preferably, the fluororesin of the dielectric layer is crosslinked and chemically bonded to the conductor layer. When the fluororesin of the dielectric layer is crosslinked and chemically bonded to the conductor layer, adhesion between the dielectric layer and the conductor layer is improved, and excellent peel strength is obtained. Therefore, for example, the peel-off between the dielectric layer and the conductor layer is unlikely to occur during circuit formation. In particular, in the case where the radio-frequency printed circuit board is a flexible printed circuit board, the peel-off between the dielectric layer and the conductor layer is also unlikely to occur during use. By crosslinking the fluororesin, it is possible to decrease deformation of the fluororesin at Tg or higher, which is useful for accurate mounting.

The crosslinking and chemical bonding of the fluororesin may be induced by irradiation with ionizing radiation. In this case, crosslinking of the fluororesin and chemical bonding between the fluororesin and the conductor layer can be performed easily and reliably by irradiation with ionizing radiation.

Furthermore, preferably, a rustproofing layer containing a silane coupling agent is disposed on the conductor layer at the interface between the conductor layer and the dielectric layer, and the silane coupling agent and the fluororesin are chemically bonded to each other. Thereby, the dielectric layer and the conductor layer can be easily and reliably bonded to each other with a desired adhesive strength.

The term "average trace width" means a value obtained by dividing the area in which the straight portion of a trace is disposed by the length of the straight portion of the trace. The "ten-point average roughness (Rz)" is the same as that described above.

According to a third invention of the present application which has been achieved in order to solve the problem described above, a radio-frequency printed circuit board includes a multilayer structure in which conductor layers and dielectric layers made of a fluororesin are alternately disposed, in which the fluororesin of the dielectric layers is chemically bonded to the conductor layers, the adhesive strength therebetween being 300 g/cm or more, the average thickness of the multilayer structure is 30 to 2,000 and the crush resistance of the multilayer structure measured by a loop stiffness test is 0.1 to 20,000 N/cm.

The radio-frequency printed circuit board can be particularly suitably used for a flexible printed circuit board. In the radio-frequency printed circuit board, since the average thickness and the crush resistance of the multilayer structure are in the ranges described above, sufficient flexibility can be achieved. Moreover, in the radio-frequency printed circuit board, since the fluororesin of the dielectric layers are chemically bonded to the conductor layers, adhesion between the dielectric layers and the conductor layers is improved, and excellent peel strength is exhibited. Therefore, for example, the peel-off between the dielectric layers and the conductor layers is unlikely to occur during circuit formation, and even when the radio-frequency printed circuit board is bent during use, the peel-off between the dielectric layers and conductor layers is unlikely to occur.

The fluororesin may be crosslinked. When the fluororesin is crosslinked, it is possible to suppress deformation at the reflow soldering temperature (about 260° C.).

The crosslinking and chemical bonding of the fluororesin may be induced by irradiation with ionizing radiation. Thereby, crosslinking of the fluororesin and chemical bonding between the fluororesin and the conductor layers can be performed easily and reliably by irradiation with ionizing radiation.

The ten-point average roughness (Rz) of the conductor layers is preferably 2.0 µm or less. In this case, even if current flows in the surface area of the conductor owing to the skin effect, the propagation distance is unlikely to be increased, and it is possible to set the transmission rate and the transmission loss of the flexible printed circuit board in suitable ranges.

The multilayer structure may be a five-layered structure in which the conductor layers are located on the outer sides. Thereby, the radio-frequency printed circuit board can be suitably used as a flexible circuit board for a flat display device, such as a liquid crystal panel display.

The average thickness of each of the dielectric layers is preferably 0.5 to 200 μm. In this case, the average thickness of the multilayer structure can be easily and reliably set in a predetermined range, and also the dielectric loss tangent can be set in a predetermined range.

Each of the conductor layers may be made of copper or aluminum. Since these materials have excellent electrical conductivity and flexibility, the flexibility can be sufficiently secured while maintaining a suitable transmission rate and transmission loss.

Preferably, a rustproofing layer containing a silane coupling agent is disposed on the conductor layer at the interface between the conductor layer and the dielectric layer, and the silane coupling agent and the fluororesin are chemically bonded to each other. Thereby, the dielectric layer and the conductor layer can be easily and reliably bonded to each other with a desired adhesive strength.

Furthermore, the dielectric layer may include an intermediate layer. The crush resistance can be adjusted by the thickness of the intermediate layer or the dielectric. Preferably, the dielectric layer includes at least an intermediate layer and a pair of fluororesin layers disposed on both surfaces of the intermediate layer, in which the ratio of the total average thickness of the intermediate layer to the total average thickness of the pair of the fluororesin layers is 0.001 to 30, the relative dielectric constant of the intermediate layer is 1.2 to 10, and the coefficient of linear expansion of the intermediate layer is $-1\times10^{-4}/°$ C. to $5\times10^{-5}/°$ C.

Since the coefficient of linear expansion of the intermediate layer is in the range described above, in the case where the radio-frequency printed circuit board is heated, thermal expansion of the dielectric layer as a whole can be suppressed by the intermediate layer. Therefore, occurrence of warpage due to heating can be suppressed. Furthermore, in the radio-frequency printed circuit board, the adhesive strength between the fluororesin layer and the conductor layer is 300 g/cm or more, and adhesion therebetween is improved. Therefore, for example, the peel-off between the dielectric layer and the conductor layer is unlikely to occur during circuit formation, and thus a decrease in the transmission rate or an increase in the resistance to transmission due to the peel-off between the dielectric layer and the conductor layer is unlikely to be caused.

The adhesive strength between the fluororesin layer and the conductor layer is preferably 600 g/cm or more. In this case, since the adhesion between the conductor layer and the fluororesin layer is further improved, it is possible to effectively suppress a decrease in the transmission rate or an increase in the resistance to transmission due to the peel-off between the dielectric layer and the conductor layer.

The fluororesin layer is preferably chemically bonded to the intermediate layer. In this case, since adhesion between the fluororesin layer and the intermediate layer is improved, the peel-off between the fluororesin layer and the intermediate layer is unlikely to occur.

The apparent relative dielectric constant of the dielectric layer is preferably 1.2 to 2.6. In this case, the dielectric layer as a whole can achieve desired electrical performance easily and reliably.

An empty space or a foamed layer may be provided, at least one of, in the fluororesin layer or the intermediate layer of the dielectric layer, at the interface between the conductor layer and the dielectric layer, and at the interface between the fluororesin layer and the intermediate layer of the dielectric layer. When an empty space of a foamed layer is present as described above, it is possible to decrease the overall dielectric constant.

Preferably, the fluororesin is crosslinked, and the crosslinking of the fluororesin and the chemical bonding between the fluororesin layer and the conductor layer are induced by irradiation with ionizing radiation. That is, although it is also possible to induce chemical bonding between the fluororesin layer and the conductor layer using a thermal radical reaction in a vacuum, by inducing chemical bonding by irradiation with ionizing radiation, the reaction is accelerated, which is preferable. Thus, it is possible to improve the adhesive strength (to produce chemical bonding) between the fluororesin layer and the conductor layer easily and reliably by irradiation with ionizing radiation.

In the case where an intermediate layer is provided, preferably, the pair of fluororesin layers have the same thickness. Specifically, the ratio of the average thickness of one fluororesin layer to the average thickness of the other fluororesin layer is preferably 0.9 to 1.1. That is, when there is a large difference in thickness between the fluororesin layers, warpage is likely to be caused by thermal expansion of the fluororesin layers. When the fluororesin layers have substantially the same thickness as described above, it is possible to suppress the problem described above.

The term "crush resistance measured by a loop stiffness test" refers to a repulsive force generated when a cylinder is formed with predetermined R and a load is applied. The "ten-point average roughness (Rz)" is the same as that described above.

Advantageous Effects of Invention

As described above, in each of the radio-frequency printed circuit board and the wiring material according to the first invention of the present application, occurrence of warpage due to heating is sufficiently suppressed, and the transmission delay and the transmission loss are decreased. Furthermore in the radio-frequency printed circuit board according to the second invention of the present application, the transmission loss is sufficiently small even in the radio-frequency range, and wiring can be formed easily and reliably. Moreover, since it is possible to provide a copper film and a dielectric layer so as not to be peeled off, for example, even when a thermal shock is applied at 260° C. for one minute, the radio-frequency printed circuit board can be suitably used, for example, for surface mounting. Furthermore, the radio-frequency printed circuit board according to the third invention of the present application has high flexibility and excellent adhesion between the conductor layer and the dielectric layer. Furthermore, since fluororesins are generally more flexible than polyimides and liquid crystal polymers (LCPs), a fluororesin substrate can be made more flexible than a polyimide substrate having the same structure when compared at the same thickness. Therefore, the crush resistance measured by the loop stiffness test can be decreased, the bending R can be decreased, and spring-back can be decreased. Thus, layout of the substrate is facilitated, which is advantageous. Accordingly, the substrate is useful as a substrate located in the periphery of a display. Furthermore, in addition to a change in thickness and mixing of a filler, by insertion of an intermediate layer or a foamed layer, it is also possible to adjust flexibility without impairing electric characteristics.

DESCRIPTION OF EMBODIMENTS

Embodiments of a radio-frequency printed circuit board according to the present invention will be described in detail below with reference to the drawings.

[Radio-Frequency Printed Circuit Board According to a First Invention of the Present Application]

Figure 1:
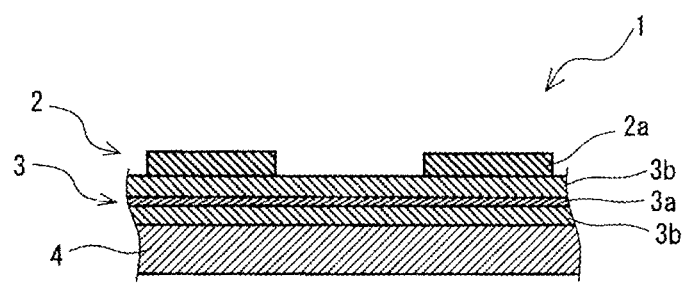
FIG. 1 is a schematic end view showing a radio-frequency printed circuit board according to an embodiment of a first invention of the present application.

A radio-frequency printed circuit board 1 shown in FIG. 1 includes a dielectric layer 3 and a pair of conductor layers 2 and 4 disposed on both surfaces of the dielectric layer 3. The radio-frequency printed circuit board 1 is, for example, used as a flexible printed circuit board.

The conductor layer 2, which is one of the pair of conductor layers 2 and 4 (located on the front surface side), constitutes a wiring pattern including traces 2a. The other conductor layer 4 constitutes a base layer on one surface of which the dielectric layer 3 is disposed. The conductor layers 2 and 4 are made of a metal, typically copper.

(Wiring Pattern)

The wiring pattern includes a plurality of traces 2a, and each trace 2a is appropriately configured to the specifications of the radio-frequency printed circuit board 1. The wiring pattern can be formed by etching or cutting of a metal film, a printing method, or the like. Preferably, each trace 2a includes a rustproofing layer (not shown) formed at the interface with the dielectric layer 3, and the rustproofing layer may contain a silane coupling agent. Furthermore, preferably, the silane coupling agent of the rustproofing layer is chemically bonded to the fluororesin of the dielectric layer 3. As will be described later, the rustproofing layer can be formed by subjecting the traces 2a to surface treatment with the silane coupling agent before chemical bonding to the dielectric layer 3.

Furthermore, the impedance of a circuit constituted by the wiring pattern is appropriately set in accordance with the specifications of the radio-frequency printed circuit board 1, and for example, can be set at 10 to 100Ω, or 30 to 80Ω.

The average thickness of the traces 2a is preferably 1 to 2,000 μm, more preferably 5 to 50 μm, and still more preferably 10 to 30 μm. When the average thickness of the traces 2a is in the range described above, it is less likely that the operation of forming the traces 2a will become cumbersome, and a desired impedance can be easily obtained.

The transmission loss of the wiring pattern at a frequency of 10 GHz is preferably 0.230 dB/cm or less, and more preferably 0.228 dB/cm or less. In this case, the printed circuit board can be suitably used for transmission in the radio-frequency range.

(Base Layer)

The base layer 4 is composed of a metal layer disposed over the entire back surface of the dielectric layer 3 as described above. The base layer 4 is used, for example, as a ground or a wiring pattern that is different from the wiring pattern 2. The average thickness of the base layer 4 is preferably 1 to 2,000 μm, and more preferably 10 to 300 μm. In this case, the base layer 4 has sufficient strength during formation of the dielectric layer 3 or the like, and the skin effect can be used at an appropriate thickness.

The surface of the base layer 4 (interface with the dielectric layer 3) is not subjected to roughening treatment or primer treatment, but is preferably chemically bonded to the surface of the dielectric layer 3 (fluororesin layer 3b) by irradiation with ionizing radiation as will be described later. Furthermore, the ten-point average roughness (Rz) of the surface of the base layer 4 can be set, for example, at 4.0 μm or less, but is preferably set at 2.0 μm or less. By setting the surface roughness of the base layer 4 as described above, it is possible to obtain a suitable transmission rate and transmission loss. Preferably, the back surface (and the front surface) of the wiring pattern also has the roughness describe above, and thereby, it is possible to obtain a suitable transmission rate and transmission loss.

(Dielectric Layer)

The dielectric layer 3 has a three-layered structure including an intermediate layer 3a and a pair of fluororesin layers 3b disposed on both surfaces of the intermediate layer 3a. The fluororesin layers 3b contain a fluororesin as a main component. Examples of the fluororesin include polytetrafluoroethylene (PTFE), a tetrafluoroethylene-perfluoroalkyl vinyl ether copolymer (PFA), a tetrafluoroethylene-hexafluoropropylene copolymer (FEP), an ethylene-tetrafluoroethylene copolymer (ETFE), and polyvinylidene fluoride (PVdF). These may be used alone or in combination of two or more.

In order to prevent warpage and to improve dimensional stability, a filler, a cloth, or a film may be inserted or mixed into the fluororesin layer. Furthermore, in order to impart coloring, a heat-dissipating property, and a reflecting property to the fluororesin layer, a filler or an additive can be mixed thereinto. Foamability may also be imparted thereto.

Preferably, the fluororesin of the fluororesin layer $3b$ is crosslinked, and specifically, carbon atoms in the polymer main chain of the fluororesin are covalently bound to each other. When the fluororesin is crosslinked, it is possible to suppress deformation at the reflow soldering temperature (about 260° C.), and therefore, a high precision substrate can be obtained. Furthermore, preferably, the fluororesin layer $3b$ is directly connected to the conductor layer, i.e., the fluororesin is chemically bonded to the material of the base layer 4. Specifically, carbon atoms in the polymer main chain of the fluororesin are covalently bound to atoms present on the surface of the base layer 4. As the method for crosslinking the fluororesin of the fluororesin layer $3b$ and further chemically bonding the fluororesin to the base layer 4, for example, a method may be used in which fluorine radicals are generated by irradiation with ionizing radiation in the absence of oxygen and in the molten state of the fluororesin. Furthermore, it is assumed that the fluororesin of the fluororesin layer $3b$ is also chemically bonded to the back surface of the wiring pattern. Note that the method of irradiation with ionizing radiation will be described in detail later in the manufacturing method of the radio-frequency printed circuit board 1.

The lower limit of the irradiation dose of ionizing radiation to the fluororesin of the fluororesin layer $3b$ is preferably 0.1 kGy, and more preferably 1 kGy. On the other hand, the upper limit of the irradiation dose is preferably 900 kGy. When the irradiation dose is less than the lower limit, it is not possible to obtain sufficient bonding strength of the dielectric layer 3 to the conductor layer. On the other hand, when the irradiation dose is more than the upper limit, there is a possibility of a decrease in strength due to decomposition reaction of the fluororesin (competitive reaction with crosslinking) and of occurrence of foaming at the interface between the copper foil and the resin.

The relative dielectric constant of the fluororesin layer $3b$ is preferably 1.3 to 2.7, more preferably 1.5 to 2.5, and still more preferably 1.6 to 2.3. When the relative dielectric constant is less than the lower limit, the copper circuit width is likely to become excessively large. On the other hand, when the relative dielectric constant is more than the upper limit, the dielectric loss tangent increases, and it is likely that the transmission loss cannot be sufficiently decreased and that a sufficient transmission rate cannot be obtained. Furthermore, since it is necessary to set the circuit width to be 50 µm or less in consideration of impedance matching, there is a possibility that mass production cannot be achieved stably.

The coefficient of linear expansion of the fluororesin layer $3b$ is, for example, $9 \times 10^{-5}$/° C. The coefficient of linear expansion of the fluororesin layer $3b$ is preferably $2 \times 10^{-5}$/° C. to $1.2 \times 10^{-4}$/° C. When the coefficient of linear expansion of the fluororesin layer $3b$ is less than the lower limit, the cost of the fluororesin layer $3b$ itself is likely to increase. On the other hand, when the coefficient of linear expansion of the fluororesin layer $3b$ is more than the upper limit, since the fluororesin layer $3b$ expands excessively when heated, it is likely that occurrence of warpage of the radio-frequency printed circuit board 1 cannot be prevented appropriately.

The total average thickness of the fluororesin layers $3b$ is preferably 0.5 µm to 1 mm, more preferably 1 to 100 µm, and still more preferably 10 to 50 µm. When the total average thickness of the fluororesin layers $3b$ is less than the lower limit, the dielectric loss tangent increases and it is likely that it will not be possible to decrease the transmission loss sufficiently, that a sufficient transmission rate cannot be obtained, and that formation of the fluororesin layers $3b$ will become cumbersome. On the other hand, when the total average thickness of the fluororesin layers $3b$ is more than the upper limit, the thickness of the dielectric layer 3 increases unnecessarily, and it is likely that the requirement for a thinner radio-frequency printed circuit board 1 will not be satisfied, that the material cost for the dielectric layer 3 will increase, and that the dielectric layer 3 will lack in flexibility when flexibility is required. Note that the total average thickness of the fluororesin layers $3b$ means the sum of the average thickness of each fluororesin layer $3b$.

Preferably, the pair of fluororesin layers $3b$ have the same thickness. Specifically, the ratio of the average thickness of one fluororesin layer $3b$ to the average thickness of the other fluororesin layer $3b$ is preferably 0.9 to 1.1. That is, when there is a large difference in thickness between the fluororesin layers $3b$, warpage is likely to be caused by thermal expansion of the fluororesin layers $3b$. When the fluororesin layers $3b$ have substantially the same thickness as described above, it is possible to suppress the problem described above.

The intermediate layer $3a$ is not particularly limited as long as it has a smaller coefficient of linear expansion than the fluororesin layers $3b$. Desirably, the intermediate layer $3a$ has an insulating property, heat resistance that does not allow melting and flowing at the melting point of the fluororesin, a tensile strength that is equal to or higher than that of the fluororesin, corrosion resistance against the fluororesin, and the coefficient of linear expansion which will be described later. For example, the intermediate layer $3a$ may be composed of a glass cloth obtained by weaving glass into a cloth form or a fluororesin-containing glass cloth obtained by impregnating such a glass cloth with a fluororesin; a cloth or nonwoven fabric made of heat-resistant fibers of metal, ceramic, alumina, PTFE, polyether ether ketone (PEEK), polyimide (PI), aramid, or the like; or a heat-resistant film or the like containing, as a main component, PTFE, LCP (type I), PI, polyamide-imide (PAI), polybenzimidazole (PBI), PEEK, PFA, a thermosetting resin, a crosslinked resin, or the like. Such heat-resistant resins and heat-resistant films have a melting point (or heat deformation temperature) that is equal to or higher than the temperature at which the fluororesin and the conductor are bonded to each other. As the method of weaving a cloth, a plain weave is preferable in order to make the middle portion thin. In the bending application, a twill weave, a satin weave, or the like is preferable. Furthermore, any known method of weaving may be applied.

The density of glass fibers of the glass cloth is preferably 1 to 5 g/m$^3$, and more preferably 2 to 3 g/m$^3$. The tensile strength of the glass fibers is preferably 1 to 10 GPa, and more preferably 2 to 5 GPa. Furthermore, the modulus in tension of the glass fibers is preferably 10 to 200 GPa, and more preferably 50 to 100 GPa. The maximum degree of elongation of the glass fibers is preferably 1% to 20%, and more preferably 3% to 10%. Furthermore, the softening point of the glass fibers is preferably 700° C. to 1,200° C., and more preferably 800° C. to 1,000° C. When the glass fibers have the properties described above, the intermediate layer $3a$ can suitably have a desired function. Note that, in the present invention, even in the case where a glass cloth is used, the glass cloth is not limited to the numerical ranges described above.

The relative dielectric constant of the intermediate layer $3a$ is, for example, about 6.8, and specifically 1.2 to 10. Here, the relative dielectric constant of the intermediate layer $3a$ is preferably 1.5 to 6, more preferably 1.8 to 5. In order to decrease the relative dielectric constant of the intermediate layer $3a$, a method is conceivable in which the intermediate layer $3a$ is foamed. In this case, the rigidity of the intermediate layer $3a$ becomes insufficient, and it is likely that it will not be possible to obtain a sufficient effect of preventing warpage. When the relative dielectric constant is less than the lower limit, the cost of the intermediate layer $3a$ is likely to increase. On the other hand, when the relative dielectric constant is more than the upper limit, the dielectric loss tangent increases, and it is likely that it will not be possible to decrease the transmission loss sufficiently and that a sufficient transmission rate will not be obtained.

The apparent relative dielectric constant (i.e., the ratio of the dielectric constant to the dielectric constant in vacuum when a pair of fluororesin layers $3b$ and the intermediate layer $3a$ disposed therebetween is considered as a medium) of the dielectric layer 3 is preferably 1.2 to 2.6, more preferably 1.4 to 2.4, and still more preferably 1.6 to 2.3. In order to set the apparent relative dielectric constant to be less than the lower limit, it is necessary to decrease the thickness of the intermediate layer $3a$ or decrease the relative dielectric constant of the intermediate layer $3a$. However, in that case, it is likely that the demerits described above will occur. On the other hand when the apparent relative dielectric constant is more than the upper limit, the dielectric loss tangent increases, and it is likely that it will not be possible to decrease the transmission loss sufficiently and that a sufficient transmission rate will not be obtained.

The coefficient of linear expansion of the intermediate layer $3a$ is $-1\times10^{-4}$/° C. to $5\times10^{-5}$/° C., preferably 0/° C. to $5\times10^{-5}$/° C., and more preferably 0/° C. to $1\times10^{-5}$/° C. When the coefficient of linear expansion of the intermediate layer $3a$ is less than the lower limit, the cost of the intermediate layer $3a$ itself is likely to increase. On the other hand, when the coefficient of linear expansion of the intermediate layer $3a$ is more than the upper limit, it is likely that occurrence of warpage of the radio-frequency printed circuit board 1 due to thermal expansion of the intermediate layer $3a$ cannot be prevented appropriately.

Furthermore, the ratio of the coefficient of linear expansion of the intermediate layer $3a$ to the coefficient of linear expansion of the fluororesin layer $3b$ is preferably 0.95 or less, and more preferably 0.1 or less. When the ratio of the coefficient of linear expansion of the intermediate layer $3a$ to that of the fluororesin layer $3b$ is more than the upper limit, it is likely that the effect of preventing occurrence of warpage of the radio-frequency printed circuit board 1 by the intermediate layer $3a$ will not be achieved sufficiently. The lower limit of ratio of the coefficient of linear expansion of the intermediate layer $3a$ to the coefficient of linear expansion of the fluororesin layer $3b$ is not particularly limited, and for example, from the viewpoint of preventing an increase in cost, the ratio may be 0.001 or more.

The average thickness of the intermediate layer $3a$ is preferably 1 to 50 µm, and more preferably 5 to 20 µm. When the average thickness of the intermediate layer $3a$ is less than the lower limit, it is likely that the effect of preventing occurrence of warpage of the radio-frequency printed circuit board 1 by the intermediate layer $3a$ will not be achieved sufficiently. On the other hand, when the average thickness of the intermediate layer $3a$ is more than the upper limit, the thickness of the dielectric layer 3 increases unnecessarily, and it is likely that the requirement for a thinner radio-frequency printed circuit board 1 will not be satisfied, that the material cost for the dielectric layer 3 will increase, and that the dielectric layer 3 will lack in flexibility when flexibility is required. A plurality of intermediate layers may be provided in a dielectric layer. Furthermore, intermediate layers of various thickness and type may be combined for use. Furthermore, by providing air or voids in the intermediate layer, in the fluororesin layer, at the interface between the intermediate layer and the fluororesin layer, or at the interface between the dielectric layer and the conductor layer, the dielectric constant can be decreased. The air or voids may be in the form of independent air bubbles or open cells. Preferably, the cells are present uniformly in the circuit or the cells have a size that does not influence the circuit.

Furthermore, the ratio of the total average thickness of the intermediate layer to the total average thickness of the fluororesin layers is 0.001 to 30. The ratio of the total average thickness of the intermediate layer $3a$ to the total average thickness of the pair of fluororesin layers $3b$ is preferably 0.1 to 2, and more preferably 0.2 to 0.5. When the ratio of the average thickness of the intermediate layer $3a$ to that of the fluororesin layers $3b$ is less than the lower limit, the intermediate layer $3a$ is excessively thin, and it is likely that the effect of preventing occurrence of warpage of the radio-frequency printed circuit board 1 by the intermediate layer $3a$ will not be achieved sufficiently. On the other hand, when the ratio is more than the upper limit, the intermediate layer $3a$ is excessively thick, and it is likely that the thickness of the dielectric layer 3 will be unnecessarily increased, that the material cost for the dielectric layer 3 will increase, and that the dielectric layer 3 will lack in flexibility when flexibility is required.

The intermediate layer $3a$ is preferably chemically bonded to the fluororesin of the fluororesin layer $3b$. Specifically, carbon atoms in the main chain of the fluororesin are covalently bound to atoms present on the surface of the intermediate layer $3a$. As the method for chemically bonding the fluororesin of the fluororesin layer $3b$ to the intermediate layer $3a$, for example, a method of irradiation with ionizing radiation in the absence of oxygen and in the molten state of the fluororesin may be used as described earlier. The details thereof will be described later.

[Manufacturing Method]

Although the manufacturing method for the radio-frequency printed circuit board 1 is not particularly limited as long as the structure described above can be obtained, the radio-frequency printed circuit board 1 can be manufactured easily and reliably by a manufacturing method including the following steps:

(1) Step of stacking a dielectric layer 3 and a wiring pattern 2 on a base layer 4

(2) Step of irradiating the dielectric layer 3 with ionizing radiation

<(1) Stacking Step>

Figure 2:
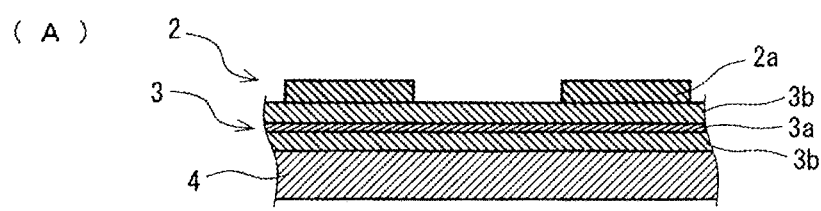
FIG. 2 includes schematic end views illustrating a manufacturing process for the radio-frequency printed circuit board shown in FIG. 1, (A) showing a state in which conductor layers and a dielectric layer are stacked, (B) showing a state in which the dielectric layer is irradiated with ionizing radiation.
Figure 2:
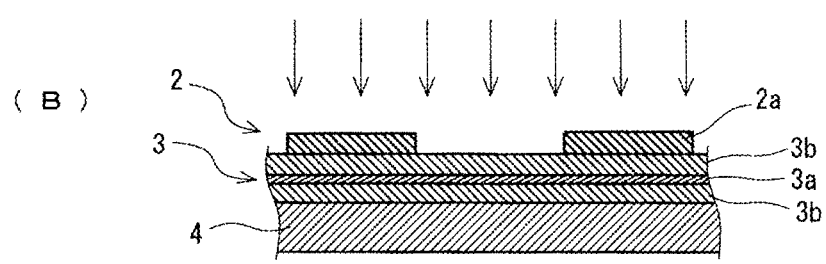

In the stacking step, as shown in FIG. 2(A), a sheet 3 for dielectric layer constituting a dielectric layer 3 and a wiring pattern 2 are disposed on the surface of a base layer 4. The sheet 3 for dielectric layer has a three-layered structure including a pair of fluororesin layers $3b$ and an intermediate layer $3a$ disposed between the pair of fluororesin layers $3b$.

Furthermore, the wiring pattern 2 is formed so as to have a desired shape by the method described earlier. The sheet 3 for dielectric layer is formed by a method in which the layers 3a and 3b are disposed by bonding with an adhesive, a method in which the fluororesin layers 3b are disposed on the intermediate layer 3a while being extruded, a method in which the layers 3a and 3b are laminated together, or the like.

<(2) Irradiation Step>

In the irradiation step, as shown in FIG. 2(B), by irradiating at least outer surfaces (front and back surfaces) of the sheet 3 composed of the fluororesin with ionizing radiation, the dielectric layer 3 is bonded to conductor layers (base layer 4 and wiring pattern 2).

In the bonding process, the multilayer body including the base layer 4, the sheet 3 for dielectric layer, and the wiring pattern 2 is placed in an oxygen-free atmosphere, specifically, in an atmosphere with an oxygen concentration of 100 ppm or less, and in a state in which the fluororesin of the outer surfaces (front and back surfaces) of the sheet 3 for dielectric layer is molten, ionizing radiation is applied to the multilayer body from the front surface side, thereby crosslinking the fluororesin and further chemically bonding the sheet 3 to the wiring pattern 2 and the base layer 4.

In the oxygen-free atmosphere, the oxygen concentration is preferably set at 5 ppm or less. When the oxygen concentration is high, the main chain of the fluororesin is likely to be broken by irradiation with ionizing radiation. Furthermore, preferably, the fluororesin is melted at a temperature that is 0° C. to less than 30° C. higher than the melting point of the fluororesin. When the fluororesin is heated at a temperature that is 30° C. or more higher than the melting point, thermal decomposition of the fluororesin is likely to be accelerated, and material properties are likely to be degraded. As the method for decreasing the oxygen concentration, a vacuum method in which inert gas, such as nitrogen, is used or the like may be used.

As the ionizing radiation, for example, γ rays, electron beams, X rays, neutron beams, high-energy ion beams, or the like may be used. Furthermore, the irradiation dose of ionizing radiation is preferably 0.01 to 1,000 kGy, and more preferably 1 to 500 kGy. When the irradiation dose is less than the lower limit, crosslinking reaction of the fluororesin may not proceed sufficiently. When the irradiation dose is more than the upper limit, decomposition of the fluororesin is likely to occur.

<(3) Wiring Pattern Formation Step>

Furthermore, a method for manufacturing the radio-frequency printed circuit board 1 may include a step of foaming a conductor layer with a predetermined pattern on the surface of a dielectric layer (wiring pattern formation step) after the dielectric layer has been formed on the surface of a base layer and the dielectric layer has been irradiated with ionizing radiation. The formation method is not particularly limited, and for example, a pattern may be formed by a method in which a metal foil is stacked, followed by etching, a method in which a punched metal foil is stacked, a method in which metal lines are arranged, or a method of coating or printing with metal particles. When the metal wiring is subjected to surface treatment with a silane coupling agent and then chemically bonded to the fluororesin (dielectric layer), the conductor layer and the fluororesin layer are chemically bonded to each other, and strong bonding can be achieved even at a flat interface with a surface roughness of 4 µm or less. As the silane coupling agent, a compound containing S atoms or N atoms is preferable because of high adhesive strength.

[Advantages]

In the radio-frequency printed circuit board 1, since the fluororesin of the dielectric layer 3 is chemically bonded to the conductor layers (base layer 4 and/or wiring pattern) by irradiation with ionizing radiation in a predetermined environment, adhesion between the dielectric layer 3 and the conductor layers 2 and 4 is improved, and excellent adhesive strength is exhibited. Therefore, for example, the peel-off between the dielectric layer 3 and the conductor layers 2 and 4 is unlikely to occur during circuit formation, and thus a decrease in the transmission rate or an increase in the resistance to transmission due to the peel-off between the dielectric layer 3 and the conductor layers 2 and 4 is unlikely to be caused.

Furthermore, the dielectric layer 3 includes a pair of fluororesin layers 3b and the intermediate layer 3a having a relative dielectric constant in a certain range, and the ratio of the average thickness of the intermediate layer 3a to the total average thickness of the pair of the fluororesin layers 3b is in the range described above. Therefore, the dielectric layer 3 as a whole can achieve desired electrical performance, and thus it is possible to improve the transmission rate and to suppress the transmission loss.

Moreover, since the coefficient of thermal expansion of the intermediate layer 3a is in a certain range, in the case where the radio-frequency printed circuit board 1 is heated during reflow soldering or the like, thermal expansion of the dielectric layer 3 as a whole can be suppressed by the intermediate layer 3a. Therefore, occurrence of warpage due to heating can be suppressed.

[Other Embodiments]

The embodiment disclosed this time is intended to be illustrative in all aspects, rather than restrictive. It is intended that the scope of the present invention is not limited to the structure of the embodiment described above, but is determined by appended claims, and includes all variations of the equivalent meanings and ranges to the claims.

In the embodiment according to the first invention of the present application, the three-layered structure including the dielectric layer 3 and a pair of conductor layers 2 and 4 has been described, but the invention is not limited thereto. For example, a radio-frequency printed circuit board having a five-layered structure including a pair of dielectric layers, a conductor layer disposed between the pair of dielectric layers, and a pair of conductor layers disposed on the outer surfaces of the pair of dielectric layers, and a multilayer structure including more layers are also covered by the claims. Furthermore, a radio-frequency printed circuit board in a state in which the wiring pattern according to the embodiment is not formed, that is, having a two-layered structure including the base layer and the dielectric layer, is also covered by the claims.

Furthermore, in the embodiment described above, although the radio-frequency printed circuit board having flexibility has been mainly described, the radio-frequency printed circuit board may not have flexibility.

Moreover, in the embodiment described above, a radio-frequency printed circuit board has been exemplified. However, the present invention can also be applied to a wiring material, for example, a radio-frequency wiring material, such as a radio-frequency flat cable, a radio-frequency wire, or a radio-frequency antenna. The wiring material according to the present invention can have the advantages described earlier by using the structure of the embodiment described above.

The first invention of the present application will be more specifically described on the basis of examples. However, it is to be understood that the present invention is not limited to the examples below.

[General Description of Radio-Frequency Printed Circuit Board]

A dielectric layer made of a resin is disposed on the surface of a base layer made of a copper film, and a strip-shaped trace is disposed on the surface of the dielectric layer. Thereby, each of radio-frequency printed circuit boards of Examples 1 and 2 and Comparative Examples 1 to 5 is obtained. The copper film used has an average thickness of 10 to 50 µm and a surface roughness of 1.5 µm. Furthermore, the copper film is provided with a rustproofing layer. The copper film and the dielectric layer are bonded to each other at a strength of 300 g/cm or more so as to achieve chemical bonding, and peeling does not occur even when bent. Furthermore, even when the copper film and the dielectric layer were heated at 260° C. or higher for one minute, peeling and blistering did not occur. Therefore, it was evaluated that the radio-frequency printed circuit boards had heat resistance that enables surface mounting.

Examples 1 to 4

In Examples 1 and 2, the dielectric layer-forming material is disposed on and bonded to the surface of the copper film. The bonding step can be carried out using a known hot pressing machine. Preferably, the bonding step is carried out at a low oxygen concentration, for example, by vacuum pressing in a nitrogen atmosphere. By carrying out the bonding step at a low oxygen concentration, oxidation of one surface (surface to be bonded to the fluororesin) of the copper film can be suppressed and a decrease in adhesion can be suppressed.

The heating temperature in the bonding step is preferably equal to or higher than the crystalline melting point of the fluororesin, more preferably 30° C. or more higher than the crystalline melting point, and still more preferably 50° C. or more higher than the crystalline melting point. By heating the fluororesin portion at such a heating temperature, radicals of the fluororesin can be effectively generated. However, if the heating temperature is excessively increased, the fluororesin itself may be degraded. Therefore, the upper limit of the heating temperature is preferably 600° C. or lower, and more preferably 500° C. or lower.

Furthermore, in addition to the heating under pressure, another known radical generation method, for example, electron beam irradiation, may be used in combination. By using electron beam irradiation or the like in combination, radicals of the fluororesin can be more effectively generated, and therefore, it is possible to further enhance reliability of adhesion between the one surface of the dielectric layer and the copper film. The dielectric layer had a three-layered structure in which fluororesin layers were disposed on both surfaces of an intermediate layer, and a glass cloth was used as the intermediate layer. The glass cloth was specified by IPC style. As the fibers of the glass cloth, E glass with a diameter of 4 µm was used. The fibers have a coefficient of linear expansion of 5.6×10E-6/K, a tensile strength of 3.2 GPa, a modulus in tension of 75 GPa, and a maximum degree of elongation of 4.8%. The surface thereof is aminosilane-treated. Furthermore, the fluororesin layer contains, as a main component, a tetrafluoroethylene-hexafluoropropylene copolymer (FEP). The total relative dielectric constant εr (apparent relative dielectric constant) of the dielectric layer is 2.1.

In Example 1, a glass cloth #1017 with an average thickness of 13 µm was used as the intermediate layer, and fluororesin layers were disposed on both surfaces of the intermediate layer so as to have an average thickness of 20 µm. Thereby, a dielectric layer having an average thickness of 48 µm was obtained. A three-layered structure was obtained such that the fluororesin layers were impregnated into portions of surface layers of the intermediate layer (5 µm in total). An electro-deposited copper foil (thickness 18 urn) was used as the copper film, and the surface roughness thereof was 1.2 µm. A rustproofing layer composed of cobalt, a silane coupling agent, and the like with a thickness of 1 µm or less is disposed on the surface of the copper foil.

In Example 2, a glass cloth #1015 with an average thickness of 15 µm was used as the intermediate layer, and fluororesin layers were disposed on both surfaces of the intermediate layer so as to have an average thickness of 20 µm. Thereby, a dielectric layer having an average thickness of 50 µm was obtained. A three-layered structure was obtained such that the fluororesin layers were impregnated into portions of surface layers of the intermediate layer (5 µm in total).

In Examples 1 and 2, the average trace thickness was set at 12 µm, and the average trace width was adjusted such that the impedance was 50Ω. As a result, the average trace width was 69.7 µm.

In Example 3, by bonding the intermediate layer while entraining air thereinto, voids were produced in the intermediate layer and at the interface between the intermediate layer and the fluororesin layer. Thereby, a radio-frequency printed circuit board was obtained. The voids were independent air bubbles and had a size with a maximum diameter of 50 µm or less. Furthermore, after pressing, electron beam irradiation was performed with 10 kGy at an oxygen concentration of 100 ppm or less and 320° C.

In Example 4, two intermediate layers were used, and a radio-frequency printed circuit board having a structure of copper foil/fluororesin/glass cloth/fluororesin/glass cloth/fluororesin/copper foil was fabricated.

Comparative Examples 1 to 5

In Comparative Example 1, a dielectric layer made of a fluororesin was used, in each of Comparative Examples 2 and 3, a dielectric layer made of a liquid crystal polymer (LCP) was used, and in each of Comparative Examples 4 and 5, a dielectric layer made of a polyimide was used.

The relative dielectric constant of the dielectric layer is 2.1 in Comparative Example 1, 3.0 in Comparative Examples 2 and 3, and 3.4 in Comparative Examples 4 and 5. The average thickness of the dielectric layer is 43 µm in Comparative Example 1, 25 µm in Comparative Example 2, 40 µm in Comparative Example 3, 25 µm in Comparative Example 4, and 40 µm in Comparative Example 5.

In Comparative Examples 1 to 5, the average trace thickness was set at 12 µm, and the average trace width was adjusted such that the impedance was 50Ω. As a result, the average trade width was 32.2 µm in Comparative Example 1, 54.2 µm in Comparative Example 2, 90.6 µm in Comparative Example 3, 49.3 µm in Comparative Example 4, and 82.6 µm in Comparative Example 5.

[Evaluation]

Regarding Examples 1 to 4 and Comparative Examples 1 to 5, the transmission loss and the dimensional change at frequencies of 10 GHz and 15 GHz are measured. The transmission loss is obtained by connecting each of Examples 1 to 4 and Comparative Examples 1 to 5 to a calibrated network analyzer and measuring characteristics of S21 and S12 of S parameters. The dimensional change is obtained by a method in which, after the copper foil on one side of the double-sided substrate has been subjected to overall etching, heating is performed at 150° C. for 30 minutes, and then the rate of change in the distance between holes marked at a distance of 10 cm apart is measured.

Figure 3:
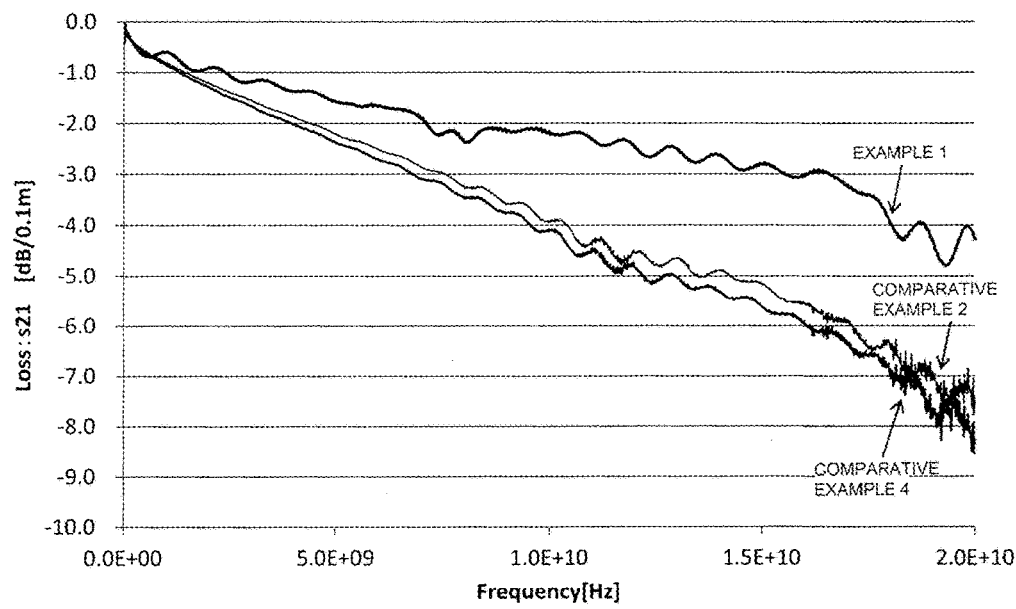
FIG. 3 is a graph showing the transmission loss per frequency regarding a radio-frequency printed circuit board of Example 1 in comparison with Comparative Examples 2 and 4 (in which the horizontal axis denotes the frequency, and the vertical axis denotes the transmission loss).
Figure 4:
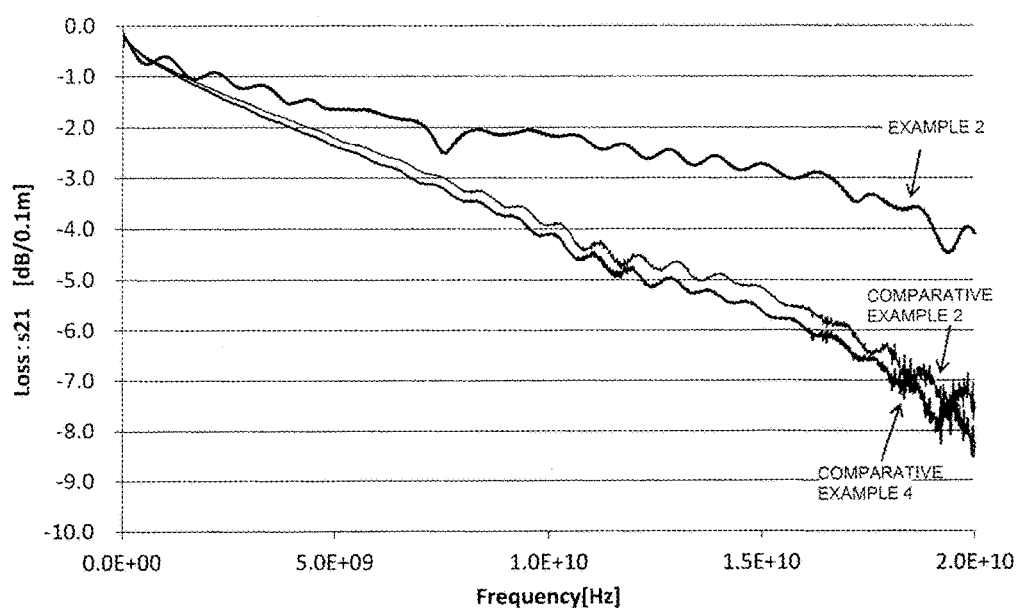
FIG. 4 is a graph showing the transmission loss per frequency regarding a radio-frequency printed circuit board of Example 2 in comparison with Comparative Examples 2 and 4 (in which the horizontal axis denotes the frequency, and the vertical axis denotes the transmission loss).
Figure 5:
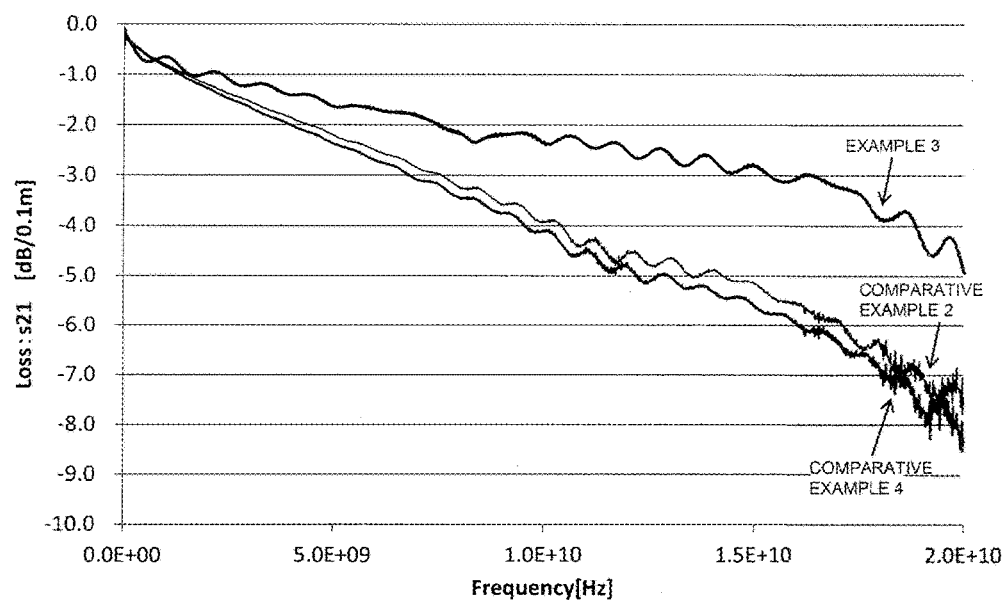
FIG. 5 is a graph showing the transmission loss per frequency regarding a radio-frequency printed circuit board of Example 3 in comparison with Comparative Examples 2 and 4 (in which the horizontal axis denotes the frequency, and the vertical axis denotes the transmission loss).

As shown in Table I, in Examples 1 to 4, the dimensional change is small, that is, warpage when heated is small, compared with Comparative Example 1. Furthermore, in Examples 1 to 4, the transmission loss is small compared with Comparative Examples 2 to 5. Furthermore, FIGS. 3 to 5 show the transmission loss per frequency regarding Examples 1 to 3 and Comparative Examples 2 and 4. As is also obvious from the graphs of FIGS. 3 to 5, in Examples 1 to 3, the transmission loss is small compared with Comparative Examples 2 and 4, and in particular, the difference in transmission loss in the radio-frequency range is noticeable.

The conductor layer 2, which is one of the pair of conductor layers 2 and 4 (located on the front surface side), constitutes a wiring pattern including traces 2a. The other conductor layer 4 constitutes a base layer on one surface (front surface) of which the dielectric layer 3 is disposed. The pair of conductor layers 2 and 4 are made of a metal, typically copper.

(Wiring Pattern)

The wiring pattern 2 includes a plurality of traces 2a, and each trace 2a is appropriately configured to the specifications of the radio-frequency printed circuit board 1. The wiring pattern 2 can be formed by etching or cutting of a metal film, a printing method, or the like. Preferably, each trace 2a includes a rustproofing layer (not shown) formed at the interface with the dielectric layer 3, and the rustproofing layer may contain a silane coupling agent. Furthermore, preferably, the silane coupling agent of the rustproofing layer is chemically bonded to the fluororesin of the dielectric layer 3. As will be described later, the rustproofing layer can be formed by subjecting the traces 2a to surface treatment with the silane coupling agent before chemical bonding to the dielectric layer 3.

TABLE I

| | Dielectric layer | | | | | | | | | | | Trans- | Trans- | |
| | Resin layer | | | | Overall | | | | | | | mission | mission | |
| | Single layer | | Intermediate | | Relative die- | | | Irradi- | Adhe- | | Total die- | loss | loss | Dimen- |
| | Material | thickness [μm] | Number of layers | Material | Thickness [μm] | Number of layers | lectric constant | Thickness [μm] | Impedance [Ω] | ation dose kGy | sive strength g/cm | Trace width [μm] | lectric constant | [dB/cm] @ 10 GHz | [dB/cm] @ 15 GHz | sional change % |
|---|---|---|---|---|---|---|---|---|---|---|---|---|---|---|---|---|
| Example 1 | FEP | 20 | 2 | Glass Cloth #1017 | 13 | 1 | 2.25 | 48 | 50 | 0 | 800 | 69.7 | 2.25 | 0.226 | 0.31 | 0.04 |
| Example 2 | FEP | 20 | 2 | Glass Cloth #1015 | 15 | 1 | 2.25 | 50 | 50 | 0 | 800 | 69.7 | 2.25 | 0.226 | 0.31 | 0.02 |
| Example 3 | FEP | 20 | 2 | Glass Cloth #1017 | 13 | 1 | 1.6 | 48 | 50 | 10 | 1100 | 69.7 | 1.6 | 0.22 | 0.31 | 0.04 |
| Example 4 | FEP | 20 | 3 | Glass Cloth #1017 | 13 | 2 | 2.4 | 70 | 50 | 0 | 900 | 69.7 | 2.3 | 0.228 | 0.32 | 0.01 |
| Comparative Example 1 | FEP | 43 | 1 | None | None | 0 | 2.1 | 43 | 50 | 0 | 600 | 32.2 | 1.8 | 0.226 | 0.3 | 2 |
| Comparative Example 2 | LCP | 25 | 1 | None | None | 0 | 3.0 | 25 | 50 | 0 | 54.2 | 54.2 | 5.5 | 0.235 | 0.55 | 0.04 |
| Comparative Example 3 | LCP | 40 | 1 | None | None | 0 | 3.0 | 40 | 50 | 0 | 90.6 | 90.6 | 5.6 | 0.236 | 0.56 | 0.04 |
| Comparative Example 4 | Polyimide | 25 | 1 | None | None | 0 | 3.4 | 25 | 50 | 0 | 49.3 | 49.3 | 5.8 | 0.290 | 0.58 | 0.05 |
| Comparative Example 5 | Polyimide | 40 | 1 | None | None | 0 | 3.4 | 40 | 50 | 0 | 82.6 | 82.6 | 5.9 | 0.293 | 0.59 | 0.05 |

[Radio-Frequency Printed Circuit Board According to a Second Invention of the Present Application]

Figure 6:
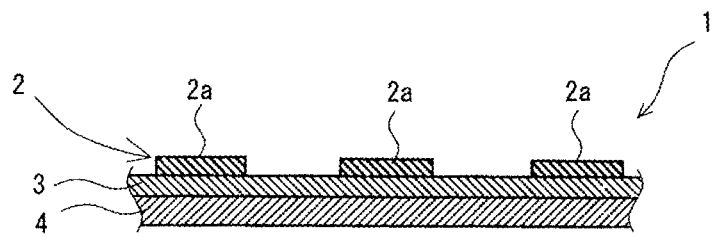
FIG. 6 is a schematic end view showing a radio-frequency printed circuit board according to an embodiment of a second invention of the present application.

A radio-frequency printed circuit board 1 shown in FIG. 6 has a three-layered structure including a dielectric layer 3 made of a fluororesin and a pair of conductor layers 2 and 4 disposed on both surfaces of the dielectric layer 3. The radio-frequency printed circuit board 1 is, for example, used as a flexible printed circuit board.

Furthermore, the impedance of a circuit constituted by the wiring pattern 2 is appropriately set in accordance with the specifications of the radio-frequency printed circuit board 1, and for example, can be set at 10 to 100Ω, and preferably is set at 30 to 80Ω.

The traces 2a of the wiring pattern 2 include strip-shaped straight portions, connecting portions for electrically connecting the straight portions to other traces, land portions for mounting various components, and the like. The average width of the traces 2a (straight portions) is 25 to 300 µm, preferably 30 to 200 µm, and more preferably 60 to 100 µm. When the average width of the traces 2a is less than the lower limit, since the allowable range of formation error of the traces 2a decreases, the operation of forming the traces 2a is likely to become cumbersome. On the other hand, when the average width of the traces 2a is more than the upper limit, the width of the traces 2a increases unnecessarily. As will be described later, it is likely that the transmission loss will increase unnecessarily even if the ratio to the average thickness of the dielectric layer 3 is adjusted, and the freedom of design for the wiring pattern 2 is decreased.

The average thickness of the traces 2a (straight portions) is preferably 1 to 2,000 µm, more preferably 5 to 50 µm, and still more preferably 10 to 30 µm. When the average thickness of the traces 2a is in the range described above, it is less likely that the operation of forming the traces 2a will become cumbersome, and a desired impedance can be easily obtained.

The transmission loss of the wiring pattern 2 at a frequency of 10 GHz is preferably 0.230 dB/cm or less, and more preferably 0.228 dB/cm or less. In this case, the printed circuit board can be suitably used for transmission in the radio-frequency range.

(Base Layer)

The base layer 4 is composed of a metal layer disposed over the entire back surface of the dielectric layer 3 as described above. The base layer 4 forms a closed circuit with the wiring pattern 2. On the other hand, for example, the base layer 4 is also used as a part of a circuit that is independent from the wiring pattern 2. The average thickness of the base layer 4 is preferably 1 to 2,000 µm, and more preferably 10 to 300 µm. In this case, the base layer 4 has sufficient strength during formation of the dielectric layer 3 or the like, and the skin effect can be used at an appropriate thickness.

The surface of the base layer 4 (interface with the dielectric layer 3) is not subjected to roughening treatment or primer treatment, but is preferably chemically bonded to the surface of the dielectric layer 3 by irradiation with ionizing radiation as will be described later. Furthermore, the ten-point average roughness (Rz) of the surface of the base layer 4 is preferably 4.0 µm or less, and particularly preferably 2.0 µm or less. Furthermore, the arithmetic average roughness (Ra) of the surface of the base layer 4 is preferably 0.2 µm or less. By setting the surface roughness of the base layer 4 as described above, it is possible to secure bonding strength by chemical bonding to the fluororesin and the like while achieving a suitable transmission rate and transmission loss. Furthermore, preferably, the fluororesin of the dielectric layer 3 is also chemically bonded to the back surface of the wiring pattern 2. The back surface of the wiring pattern 2 preferably has the surface roughness described above, and thereby, it is possible to obtain a more suitable transmission rate and transmission loss. Here, the "arithmetic average roughness (Ra)" is a value measured in accordance with JIS B 0601-1994, in which the evaluation length (1) is set at 3.2 mm, and the cutoff value (λc) is set at 0.8 mm.

(Dielectric Layer)

The dielectric layer 3 is made of a resin layer containing a fluororesin as a main component. Examples of the fluororesin as the main component of the dielectric layer 3 include the same fluororesins described earlier. These may be used alone or in combination of two or more. In order to prevent warpage and to improve dimensional stability, a filler, a cloth, or a film may be inserted or mixed into the fluororesin layer. Furthermore, in order to impart coloring, a heat-dissipating property, and a reflecting property to the fluororesin layer, a filler or an additive can be mixed thereinto.

Preferably, the fluororesin of the dielectric layer 3 is crosslinked, and specifically, carbon atoms in the polymer main chain of the fluororesin are covalently bound to each other. Furthermore, preferably, the fluororesin is chemically bonded to the material of the base layer 4. Specifically, carbon atoms in the polymer main chain of the fluororesin are covalently bound to atoms present on the surface of the base layer 4. As the method for crosslinking the fluororesin of the dielectric layer 3 and further chemically bonding the fluororesin to the base layer 4, for example, a method may be used in which fluorine radicals are generated by irradiation with ionizing radiation in the absence of oxygen and in the molten state of the fluororesin.

The relative dielectric constant of the dielectric layer 3 is preferably 1.2 to 2.7, more preferably 1.4 to 2.5, still more preferably 1.6 to 2.3, and most preferably about 2.25. When the relative dielectric constant is less than the lower limit, it becomes difficult to secure the dimensional stability of the dielectric layer 3. In particular, in the case where the relative dielectric constant is decreased by foaming, it is likely that the modulus of elasticity will decrease excessively, processing and transportation will become difficult, and the cost will increase. On the other hand, when the relative dielectric constant is more than the upper limit, the dielectric loss tangent increases, and it is likely that it will not be possible to decrease the transmission loss sufficiently and that a sufficient transmission rate will not be obtained.

The average thickness of the dielectric layer 3 (average thickness of the region in which the trace 2a is disposed) is 5 to 125 µm, preferably 7 to 100 µm, and more preferably 10 to 50 µm. When the average thickness of the dielectric layer 3 is less than the lower limit, the dielectric loss tangent increases and it is likely that it will not be possible to decrease the transmission loss sufficiently, that a sufficient transmission rate cannot be obtained, and that the operation of forming the radio-frequency printed circuit board 1 will become difficult. On the other hand, when the average thickness of the dielectric layer 3 is more than the upper limit, the thickness of the dielectric layer 3 increases unnecessarily, and it is likely that the requirement for a thinner radio-frequency printed circuit board 1 will not be satisfied, that the material cost for the dielectric layer 3 will increase, and that the dielectric layer 3 will lack in flexibility when flexibility is required.

Furthermore, the ratio of the average width of the trace 2a to the average thickness of the dielectric layer 3 (average thickness of the region in which the trace 2a is disposed) is 2.4 to 30, preferably 2.6 to 5, and more preferably 2.8 to 3.5. When the ratio is less than the lower limit, the width of the trace 2a may decrease excessively or the thickness of the dielectric layer 3 may increase unnecessarily, and thus it is likely that the demerits described above will occur. On the other hand, when the ratio is more than the upper limit, the width of the trace 2a may increase unnecessarily or the thickness of the dielectric layer 3 may decrease excessively, and thus it is likely that the demerits described above will occur.

[Manufacturing Method]

Although the manufacturing method for the radio-frequency printed circuit board 1 is not particularly limited as long as the structure described above can be obtained, the radio-frequency printed circuit board 1 can be manufactured easily and reliably by a manufacturing method including the following steps:

(1) Step of stacking a dielectric layer 3 on the surface of a base layer 4 by using a dielectric layer-forming composition 3

(2) Step of irradiating the dielectric layer 3 with ionizing radiation (3) Step of forming a wiring pattern 2 on the surface of the dielectric layer 3

<(1) Dielectric Layer Stacking Step>

Figure 7:
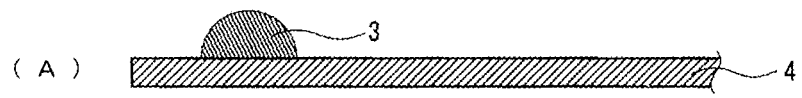
FIG. 7 includes schematic end views illustrating a manufacturing process for the radio-frequency printed circuit board shown in FIG. 6, (A) showing a state in which a dielectric layer-forming material is supplied onto a base layer, (B) showing a state in which a dielectric layer is formed by planarizing the dielectric layer-forming material, (C) showing a state in which the dielectric layer is irradiated with ionizing radiation to perform crosslinking and the like, (D) showing a state in which a wiring pattern is disposed.
Figure 7:
Figure 7:
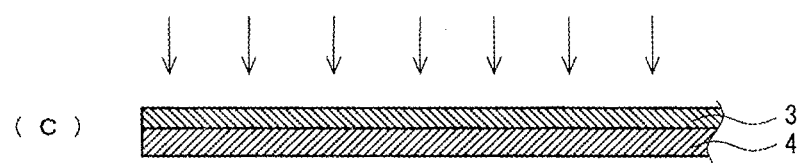
Figure 7:
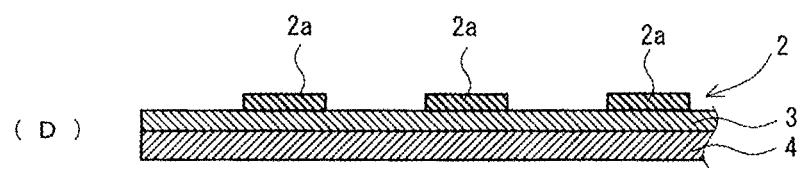

The stacking step includes a process in which a dielectric layer-forming composition 3 is supplied as a dispersion onto a base layer 4 which is a metal layer as shown in FIG. 7(A), and a process in which the supplied dielectric layer-forming composition 3 is uniformly applied onto the surface of the base layer 4 using a spin-coating method, a casting method, or the like as shown in FIG. 7(B), followed by drying, and baking by heating. Alternatively, the base layer 4 and a film composed of a dielectric-forming composition may be stacked on each other. The dielectric layer-forming composition contains, as a main component, the fluororesin described above. In addition to the fluororesin, any component, such as a thermoplastic resin, a heat-transfer agent, hollow particles, a plating agent, an adhesion promoter, or a crosslinking auxiliary, may be added thereto.

<(2) Ionizing Radiation Irradiation Step>

In the ionizing radiation irradiation step, as shown in FIG. 7(C), by irradiating the dielectric layer 3 with ionizing radiation, the fluororesin in the dielectric layer 3 is crosslinked and chemically bonded to the surface of the base layer 4. Regarding the ionizing radiation irradiation step, the wiring pattern formation step (3) which will be described later may be performed after the dielectric layer stacking step (1), and then the surface of the wiring pattern 2 may be irradiated with ionizing radiation.

In the process of ionizing radiation irradiation, in an oxygen-free atmosphere, specifically, in an atmosphere with an oxygen concentration of 100 ppm or less, and in a state in which the fluororesin is molten, ionizing radiation is applied, thereby crosslinking the fluororesin and further chemically bonding the fluororesin to the base layer 4.

In the oxygen-free atmosphere, the oxygen concentration is preferably set at 5 ppm or less. When the oxygen concentration is high, the main chain of the fluororesin is likely to be broken by irradiation with ionizing radiation. Furthermore, preferably, the fluororesin is melted at a temperature that is 0° C. to less than 30° C. higher than the melting point of the fluororesin. When the fluororesin is heated at a temperature that is 30° C. or more higher than the melting point, thermal decomposition of the fluororesin is likely to be accelerated, and material properties are likely to be degraded.

As the ionizing radiation, for example, γ rays, electron beams, X rays, neutron beams, high-energy ion beams, or the like may be used. Furthermore, the irradiation dose of ionizing radiation is preferably 0.01 to 1,000 kGy, and more preferably 1 to 500 kGy. When the irradiation dose is less than the lower limit, crosslinking reaction of the fluororesin may not proceed sufficiently. When the irradiation dose is more than the upper limit, decomposition of the fluororesin is likely to occur.

<(3) Wiring Pattern Formation Step>

In the wiring pattern formation step, a conductor layer with a predetermined pattern is formed on the surface of the dielectric layer 3. The formation method is not particularly limited, and for example, a pattern may be formed by a method in which a metal foil is stacked, followed by etching, a method in which a punched metal foil is stacked, a method in which metal lines are arranged, or the like.

[Advantages]

In the radio-frequency printed circuit board 1, since the allowable range of formation error for traces 2a can be set to be large, formation of the traces 2a can be performed easily and reliably. Furthermore, by setting the thickness of the dielectric layer 3 made of the fluororesin and the ratio of the average width of the trace 2a to the thickness of the dielectric layer 3 to be in the ranges described above, despite the average width of the trace 2a being in the range described above, the dielectric loss tangent can be sufficiently decreased, and the transmission loss can be sufficiently decreased even in the radio-frequency range.

Furthermore, since the fluororesin of the dielectric layer 3 is chemically bonded to the conductor layer 4 by irradiation with ionizing radiation in a predetermined environment, adhesion between the dielectric layer 3 and the conductor layer 4 is improved, and excellent peel strength is obtained. Therefore, for example, the peel-off between the dielectric layer 3 and the conductor layer 4 is unlikely to occur during circuit formation. In particular, in the case of a flexible printed circuit board which requires flexibility, the peel-off between the dielectric layer 3 and the conductor layer 4 is unlikely to occur during use. Furthermore, in the case where the wiring pattern formation step (3) is performed after the dielectric layer stacking step (1), and then the irradiation step is performed, i.e., in the chase where after the conductive pattern 2 is disposed on the surface of the dielectric layer 3, ionizing radiation irradiation is performed as described above, since the fluororesin of the dielectric layer 3 is chemically bonded to the wiring pattern 2, it is possible to improve adhesion between the dielectric layer 3 and the wiring pattern 2.

[Other Embodiments]

In the embodiment according to the second invention of the present application, the three-layered structure including the dielectric layer 3 and a pair of conductor layers 2 and 4 has been described, but the invention is not limited thereto. For example, a radio-frequency printed circuit board having a five-layered structure including a pair of dielectric layers, a conductor layer disposed between the pair of dielectric layers, and a pair of conductor layers disposed on the outer surfaces of the pair of dielectric layers, and a multilayer structure including more layers are also covered by the claims.

Furthermore, in the embodiment described above, although the radio-frequency printed circuit board having flexibility has been mainly described, the radio-frequency printed circuit board may not have flexibility.

The second invention of the present application will be more specifically described on the basis of examples. However, it is to be understood that the present invention is not limited to the examples below.

[General Description of Radio-Frequency Printed Circuit Board]

A dielectric layer made of a resin is disposed on the surface of a base layer made of a copper film, and a strip-shaped trace is disposed on the surface of the dielectric layer. Thereby, each of radio-frequency printed circuit boards of Examples 5 to 10 and Comparative Examples 6 to 17 is obtained. The copper film used has an average thickness of 10 to 50 μm and a surface roughness of 1.5 μm. Furthermore, the copper film is provided with a rustproofing layer. The copper film and the dielectric layer are bonded to each other at a strength of 300 g/cm or more so as to achieve chemical bonding, and peeling does not occur even when bent. Furthermore, even when the copper film and the dielectric layer were subjected to thermal shock at 260° C. for one minute, peeling did not occur.

Examples 5 to 10

In Examples 5 to 10, a fluororesin material containing a tetrafluoroethylene-hexafluoropropylene copolymer (FEP) as a main component is disposed on the surface of the copper film, and a dielectric layer is formed by irradiation with ionizing radiation as described in the embodiment. The relative dielectric constant εr of the dielectric layer is 2.1. The average thickness of the dielectric layer is 12.5 μm in Examples 5 and 8, 25 μm in Examples 6 and 9, and 40 μm in Examples 7 and 10.

The average trace thickness is set at 12 μm in Examples 5 to 7 and 20 μm in Examples 8 to 10, and the average trace width is adjusted such that the impedance is 50Ω. As a result, the average trace width is 32.2 μm in Example 5, 69.7 pin in Example 6, 115.9 μm in Example 7, 29.8 μm in Example 8, 65.9 μm in Example 9, and 111.0 μm in Example 10.

Comparative Examples 6 to 11

In Comparative Examples 6 to 11, instead of the dielectric layer made of a fluororesin in Examples 5 to 10, a dielectric layer made of a liquid crystal polymer (LCP) is formed. The relative dielectric constant εr of the dielectric layer is 3.0.

The average thickness of the dielectric layer is 12.5 μm in Comparative Examples 6 and 9, 25 μm in Comparative Examples 7 and 10, and 40 μm in Comparative Examples 8 and 11.

The average trace thickness is set at 12 μm in Comparative Examples 6 to 8 and 20 μm in Comparative Examples 9 to 11, and the average trace width is adjusted such that the impedance is 50Ω. As a result, the average trace width is 24.7 μm in Comparative Example 6, 54.2 μm in Comparative Example 7, 90.6 μm in Comparative Example 8, 22.6 μm in Comparative Example 9, 50.8 μm in Comparative Example 10, and 86.3 μm in Comparative Example 11.

Comparative Examples 12 to 17

In Comparative Examples 12 to 17, instead of the dielectric layer made of a fluororesin in Examples 5 to 10, a dielectric layer made of a polyimide is faulted. The relative dielectric constant εr of the dielectric layer is 3.4. The average thickness of the dielectric layer is 12.5 μm in Comparative Examples 12 and 15, 25 μm in Comparative Examples 13 and 16, and 40 μm in Comparative Examples 14 and 17.

The average trace thickness is set at 12 μm in Comparative Examples 12 to 14 and 20 μm in Comparative Examples 15 to 17, and the average trace width is adjusted such that the impedance is 50Ω. As a result, the average trace width is 22.3 μm in Comparative Example 12, 49.3 μm in Comparative Example 13, 82.6 μm in Comparative Example 14, 20.3 μm in Comparative Example 15, 46.0 μm in Comparative Example 16, and 78.5 μm in Comparative Example 17.

[Transmission Loss (Unit of Measure: dB/10 cm)]

Regarding Examples 5 to 10 and Comparative Examples 6 to 17, the transmission loss at a frequency of 10 GHz is measured, and the results thereof are shown in Table II. As is obvious from Table II, in each Example, the transmission loss is small compared with the corresponding Comparative Example. The transmission loss is obtained by connecting each of Examples 5 to 10 and Comparative Examples 6 to 17 to a calibrated network analyzer and measuring characteristics of S21 and S12 of S parameters.

TABLE II

|  | Dielectric layer | | | Impedance [Ω] | Trace width [μm] | Ratio of thickness of dielectric layer to trace width | Transmission loss [dB/cm] @ 10 GHz |
|---|---|---|---|---|---|---|---|
|  | Material | Relative dielectric constant | Thickness [μm] | | | | |
| Example 5 | FEP | 2.1 | 12.5 | 50 | 32.2 | 2.6 | 0.2260 |
| Example 6 | FEP | 2.1 | 25 | 50 | 69.7 | 2.8 | 0.2262 |
| Example 7 | FEP | 2.1 | 40 | 50 | 115.9 | 2.9 | 0.2264 |
| Example 8 | FEP | 2.1 | 12.5 | 50 | 29.8 | 2.4 | 0.2258 |
| Example 9 | FEP | 2.1 | 25 | 50 | 65.9 | 2.6 | 0.2261 |
| Example 10 | FEP | 2.1 | 40 | 50 | 111.0 | 2.8 | 0.2262 |
| Comparative Example 6 | LCP | 3.0 | 12.5 | 50 | 24.7 | 2.0 | 0.2346 |
| Comparative Example 7 | LCP | 3.0 | 25 | 50 | 54.2 | 2.2 | 0.2357 |
| Comparative Example 8 | LCP | 3.0 | 40 | 50 | 90.6 | 2.3 | 0.2363 |
| Comparative Example 9 | LCP | 3.0 | 12.5 | 50 | 22.6 | 1.8 | 0.2335 |
| Comparative Example 10 | LCP | 3.0 | 25 | 50 | 50.8 | 2.0 | 0.2349 |
| Comparative Example 11 | LCP | 3.0 | 40 | 50 | 86.3 | 2.2 | 0.2357 |
| Comparative Example 12 | Polyimide | 3.4 | 12.5 | 50 | 22.3 | 1.8 | 0.2828 |
| Comparative Example 13 | Polyimide | 3.4 | 25 | 50 | 49.3 | 2.0 | 0.2895 |
| Comparative Example 14 | Polyimide | 3.4 | 40 | 50 | 82.6 | 2.1 | 0.2929 |
| Comparative Example 15 | Polyimide | 3.4 | 12.5 | 50 | 20.3 | 1.6 | 0.2770 |
| Comparative Example 16 | Polyimide | 3.4 | 25 | 50 | 46.0 | 1.8 | 0.2848 |
| Comparative Example 17 | Polyimide | 3.4 | 40 | 50 | 78.5 | 2.0 | 0.2892 |

[Radio-Frequency Printed Circuit Board According to a Third Invention of the Present Application]

Figure 8:
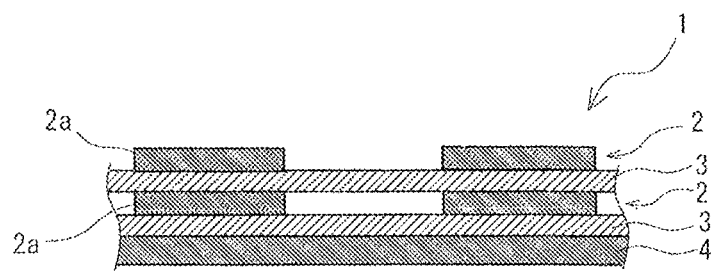
FIG. 8 is a schematic end view showing a radio-frequency printed circuit board according to an embodiment of a third invention of the present application.

A radio-frequency printed circuit board 1 shown in FIG. 8 has a multilayer structure including conductor layers 2 and 4 and dielectric layers 3 made of a fluororesin alternately stacked on each other. The multilayer structure is a five-layered structure in which the conductor layers 2 and 4 are located on the outer sides. Specifically, in the multilayer structure, the conductor layer 2, the dielectric layer 3, the conductor layer 2, the dielectric layer 3, and the conductor layer 4 are stacked in that order. Since the layers 2, 3, and 4 have flexibility, the radio-frequency printed circuit board 1 has flexibility and can be suitably used as a flexible printed circuit board.

The crush resistance of the multilayer structure measured by a loop stiffness test is 0.1 to 20,000 N/cm, preferably 0.1 to 5 N/cm, and more preferably 0.1 to 2 N/cm. When the crush resistance is less than the lower limit, the flexibility of the radio-frequency printed circuit board 1 is likely to become insufficient. On the other hand, when the crush resistance is more than the upper limit, it is likely that handling of the circuit board 1 will become difficult and that the costs of materials for the circuit board 1 will increase.

The average thickness of the multilayer structure is 30 to 2,000 µm, preferably 30 to 1,000 µm, and more preferably 30 to 500 µm. In order to set the average thickness of the multilayer structure to be less than the lower limit, it is necessary to decrease the thickness of the conductor layers 2 and 4 and the dielectric layers 3, and it is likely that costs for forming the layers will increase and that it will not be possible to obtain sufficient electrical properties, such as the transmission rate. On the other hand, when the average thickness is more than the upper limit, the flexibility of the radio-frequency printed circuit board 1 is likely to become insufficient.

The conductor layer 4 (on the back surface side), which is one of the pair of conductor layers 2 and 4 located on the outer sides, constitutes a base layer on one surface of which the dielectric layer 3 is disposed. The other conductor layer 2 (on the front surface side), which is one of the pair of conductor layers 2 and 4, and the intermediate conductor layer 2 interposed between the dielectric layers 3 each constitute a wiring pattern including traces 2a. The conductor layers 2 and 4 are made of a metal, specifically copper or aluminum.

(Base Layer)

The base layer 4 is composed of a metal layer disposed over the entire back surface of the dielectric layer 3 as described above. The base layer 4 is used, for example, as a wiring pattern that is different from the wiring pattern 2. The average thickness of the base layer 4 is preferably 1 to 200 µm, and more preferably 10 to 100 µm. In this case, the base layer 4 has sufficient strength during formation of the dielectric layer 3 or the like, and the skin effect can be used at an appropriate thickness.

The surface of the base layer 4 (interface with the dielectric layer 3) is not subjected to roughening treatment or primer treatment, but is chemically bonded to the surface of the dielectric layer 3 by irradiation with ionizing radiation as will be described later. Furthermore, the ten-point average roughness (Rz) of the surface of the base layer 4 is preferably 2.0 µm or less. Furthermore, the arithmetic average roughness (Ra) of the surface of the base layer 4 is preferably 0.2 µm or less. By setting the surface roughness of the base layer 4 as described above, it is possible to secure bonding strength by chemical bonding to the fluororesin and the like while achieving a suitable transmission rate and transmission loss. Furthermore, preferably, the fluororesin of the dielectric layer 3 is also chemically bonded to the back surface of the wiring pattern 2. The back surface of the wiring pattern 2 preferably has the surface roughness described above, and thereby, it is possible to obtain a more suitable transmission rate and transmission loss. The measurement method for the arithmetic average roughness (Ra) is as described above.

(Wiring Pattern)

The wiring pattern 2 includes a plurality of traces 2a, and each trace 2a is appropriately configured to the specifications of the radio-frequency printed circuit board 1. The wiring pattern 2 can be formed by etching or cutting of a metal film, a printing method, or the like.

Furthermore, the impedance of a circuit constituted by the wiring pattern 2 is appropriately set in accordance with the specifications of the radio-frequency printed circuit board 1, and for example, can be set at 10 to 100Ω, and is preferably set at 30 to 80Ω.

The average thickness of the traces 2a is preferably 1 to 200 µm, more preferably 5 to 50 µm, and still more preferably 10 to 30 µm. When the average thickness of the traces 2a is in the range described above, it is less likely that the operation of forming the traces 2a will become cumbersome, and a desired impedance can be easily obtained.

The transmission loss of the wiring pattern 2 at a frequency of 10 GHz is preferably 0.9 dB/m or less, and more preferably 0.8 dB/m or less. In this case, the flexible printed circuit board 1 can be suitably used for transmission in the radio-frequency range.

(Dielectric Layer)

The dielectric layer 3 is made of a resin layer containing a fluororesin as a main component. Examples of the fluororesin as the main component of the dielectric layer 3 include the same fluororesins described earlier. These may be used alone or in combination of two or more.

Preferably, the fluororesin of the dielectric layer 3 is crosslinked. In the crosslinked state, carbon atoms in the polymer main chain of the fluororesin are covalently bound to each other. Furthermore, the fluororesin is chemically bonded to the material of the base layer 4. Specifically, carbon atoms in the polymer main chain of the fluororesin are covalently bound to atoms present on the surface of the base layer 4 (and the front and back surfaces of the wiring pattern 2). As the method for crosslinking the fluororesin of the dielectric layer 3 and further chemically bonding the fluororesin to the base layer 4 (and the wiring pattern 2), for example, a method may be used in which irradiation with ionizing radiation is performed in the absence of oxygen and in the molten state of the fluororesin.

The relative dielectric constant of the dielectric layer 3 is preferably 1.5 to 2.7, more preferably 1.8 to 2.5, still more preferably 2.0 to 2.2, and most preferably about 2.1. When the relative dielectric constant is less than the lower limit, the manufacturing cost of the dielectric layer 3 is likely to increase. On the other hand, when the relative dielectric constant is more than the upper limit, the dielectric loss tangent increases, and it is likely that it will not be possible to decrease the transmission loss sufficiently and that a sufficient transmission rate will not be obtained.

The average thickness of the dielectric layer 3 is preferably 0.5 to 200 µm, more preferably 1 to 100 µm, and still more preferably 10 to 50 µm. When the average thickness of the dielectric layer 3 is less than the lower limit, the dielectric loss tangent increases and it is likely that it will not be possible to decrease the transmission loss sufficiently, that a sufficient transmission rate cannot be obtained, and that formation of the dielectric layer 3 will become cumbersome. On the other hand, when the average thickness of the dielectric layer 3 is more than the upper limit, the thickness of the dielectric layer 3 increases unnecessarily, and it is likely that the requirement for a thinner radio-frequency printed circuit board 1 will not be satisfied, that the material cost for the dielectric layer 3 will increase, and that the dielectric layer 3 will lack in flexibility.

[Manufacturing Method]

Although the manufacturing method for the radio-frequency printed circuit board 1 is not particularly limited as long as the structure described above can be obtained, the radio-frequency printed circuit board 1 can be manufactured easily and reliably by a manufacturing method including the following steps:

(1) Step of stacking a dielectric layer 3 and a wiring pattern 2 repeatedly on a base layer 4

(2) Step of irradiating the dielectric layer 3 with ionizing radiation

<(1) Stacking Step>

Figure 9:
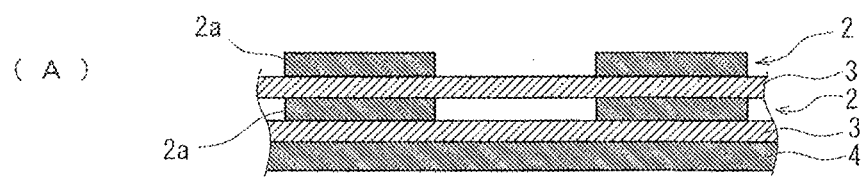
FIG. 9 includes schematic end views illustrating a manufacturing process for the radio-frequency printed circuit board shown in FIG. 8, (A) showing a state in which conductor layers and dielectric layers are stacked, (B) showing a state in which the conductor layers and the dielectric layers are bonded to each other.
Figure 9:
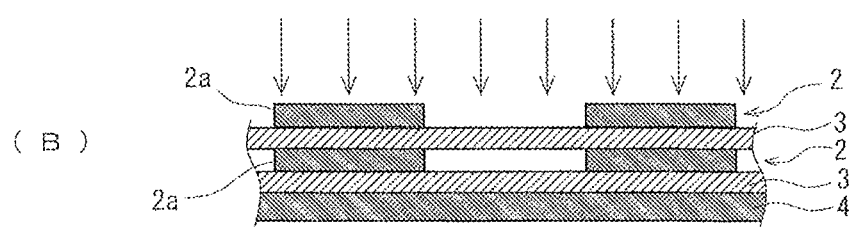

In the stacking step, as shown in FIG. 9(A), fluororesin sheets constituting dielectric layers 3 and wiring patterns 2 are alternately disposed on the surface of a base layer 4. The wiring patterns 2 are each formed so as to have a desired shape by the method described earlier.

The bonding step can be carried out using a known hot pressing machine. Preferably, the bonding step is carried out at a low oxygen concentration, for example, by vacuum pressing in a nitrogen atmosphere. By carrying out the bonding step at a low oxygen concentration, oxidation of one surface (surface to be bonded to the fluororesin) of the copper film serving as the base layer can be suppressed and a decrease in adhesion can be suppressed.

The heating temperature in the bonding step is preferably equal to or higher than the crystalline melting point of the fluororesin, more preferably 30° C. or more higher than the crystalline melting point, and still more preferably 50° C. or more higher than the crystalline melting point. For example, in the case where the main component of the fluororesin portion is FEP, since the crystalline melting point of the FEP is about 270° C., the heating temperature is preferably 270° C. or higher, more preferably 300° C. or higher, and still more preferably 320° C. or higher. By heating the fluororesin portion at such a heating temperature, radicals of the fluororesin can be effectively generated. However, if the heating temperature is excessively increased, the fluororesin itself may be degraded. Therefore, the upper limit of the heating temperature is preferably 600° C. or lower, and more preferably 500° C. or lower.

<(2) Irradiation Step>

In the irradiation step, as shown in FIG. 9(B), by irradiating at least outer surfaces (front and back surfaces) of the fluororesin sheets 3 with ionizing radiation, the dielectric layers 3 are bonded to conductor layers (base layer 4 and wiring patterns 2).

In the bonding process, the multilayer body including the base layer 4, the fluororesin sheets 3, and the wiring patterns 2 is placed in an oxygen-free atmosphere, specifically, in an atmosphere with an oxygen concentration of 100 ppm or less, and in a state in which the outer surfaces (front and back surfaces) of the fluororesin sheets 3 are molten, ionizing radiation is applied to the multilayer body, thereby crosslinking the fluororesin and further chemically bonding the sheet 3 to the base layer 4.

In the oxygen-free atmosphere, the oxygen concentration is preferably set at 5 ppm or less. When the oxygen concentration is high, the main chain of the fluororesin is likely to be broken by irradiation with ionizing radiation. Furthermore, preferably, the fluororesin is melted at a temperature that is 0° C. to less than 30° C. higher than the melting point of the fluororesin. When the fluororesin is heated at a temperature that is 30° C. or more higher than the melting point, thermal decomposition of the fluororesin is likely to be accelerated, and material properties are likely to be degraded.

As the ionizing radiation, for example, γ rays, electron beams, X rays, neutron beams, high-energy ion beams, or the like may be used. Furthermore, the irradiation dose of ionizing radiation is preferably 1 to 1,000 kGy, and more preferably 10 to 500 kGy. When the irradiation dose is less than the lower limit, crosslinking reaction of the fluororesin may not proceed sufficiently. When the irradiation dose is more than the upper limit, decomposition of the fluororesin is likely to occur.

[Advantages]

In the radio-frequency printed circuit board 1, since the fluororesin of the dielectric layers 3 is chemically bonded to the conductor layers 2 and 4 (base layer 4 and/or wiring patterns 2) by irradiation with ionizing radiation in a predetermined environment, adhesion between the dielectric layers 3 and the conductor layers 2 and 4 is improved, and excellent peel strength is exhibited. Therefore, for example, the peel-off between the dielectric layers 3 and the conductor layers 2 and 4 is unlikely to occur during circuit formation, and the peel-off between the dielectric layers 3 and the conductor layers 2 and 4 is also unlikely to occur during use.

[Other Embodiments]

In the embodiment according to the third invention of the present application, the five-layered structure including two dielectric layers 3 and three conductor layers 2 and 4 has been described, but the invention is not limited thereto. For example, a structure including more than five layers is also covered by the claims. Furthermore, a three-layered structure including a dielectric layer and a pair of conductor layers is also covered by the claims.

The third invention of the present application will be more specifically described on the basis of examples. However, it is to be understood that the present invention is not limited to the examples below.

[General Description of Radio-Frequency Printed Circuit Board]

A dielectric layer made of a resin is disposed on the surface of a base layer made of a copper film, and a strip-shaped trace is disposed on the surface of the dielectric layer. Thereby, each of radio-frequency printed circuit boards of Example 11 and Comparative Example 18 is obtained. The copper film and the dielectric layer are bonded to each other at a strength of 300 g/cm or more so as to achieve chemical bonding, and peeling does not occur even when bent. Furthermore, even when the copper film and the dielectric layer were heated at 260° C. or higher for one minute, peeling and blistering did not occur. Therefore, it was evaluated that the radio-frequency printed circuit boards had heat resistance that enables surface mounting.

Example 11

In Example 11, the dielectric layer-forming material is disposed on and bonded to the surface of the copper film. The dielectric layer had a three-layered structure in which fluororesin layers were disposed on both surfaces of an intermediate layer, and a glass cloth was used as the intermediate layer. The glass cloth was specified by IPC style. As the fibers of the glass cloth, E glass with a diameter of 4 μm was used. The fibers have a coefficient of linear expansion of 5.6×10E-6/K, a tensile strength of 3.2 GPa, a modulus in tension of 75 GPa, and a maximum degree of elongation of 4.8%. The surface thereof is aminosilane-treated. Furthermore, the fluororesin layer contains, as a main component, a tetrafluoroethylene-hexafluoropropylene copolymer (FEP). The total relative dielectric constant εr (apparent relative dielectric constant) of the dielectric layer is 2.1.

In Example 11, a glass cloth #1017 with an average thickness of 13 μm was used as the intermediate layer, and fluororesin layers (FEP) were disposed on both surfaces of the intermediate layer so as to have an average thickness of 20 μm. Thereby, a dielectric layer having an average thickness of 50 μm was obtained. A three-layered structure was obtained such that the fluororesin layers were impregnated into the intermediate layer. An electro-deposited copper foil (thickness 18 μm) was used as the copper foil, and the surface roughness thereof was 1.2 μm. A rustproofing layer composed of cobalt, a silane coupling agent, and the like with a thickness of 1 μm or less is disposed on the surface of the copper foil.

The crush resistance of the circuit board measured by a loop stiffness test was 0.5 N/cm.

Comparative Example 18

In Comparative Example 18, a dielectric layer made of a polyimide (without an intermediate layer) was used. The thickness of the polyimide was 50 μm, and except for this, testing was performing in the same manner as in Example 11. The crush resistance of the circuit board measured by a loop stiffness test was 1.5 N/cm.

INDUSTRIAL APPLICABILITY

As described above, the radio-frequency printed circuit board and the wiring member according to the present invention have a high transmission rate and a small transmission loss even in the radio-frequency range, and therefore, can be suitably used, for example, in communication devices and the like that use radio-frequency waves. Furthermore, the radio-frequency printed circuit board according to the present invention is highly flexible and can be suitably used, for example, in flexible printed circuit boards and the like used for liquid crystal displays.

REFERENCE SIGNS LIST 1 radio-frequency printed circuit board
2 wiring pattern (conductor layer)
2a trace
3 dielectric layer (sheet for dielectric layer or dielectric layer-forming material)
3a intermediate layer
3b fluororesin layer
4 base layer (conductor layer)

The invention claimed is:

1. A radio-frequency printed circuit board comprising a dielectric layer and a conductor layer disposed on or over at least one surface of the dielectric layer, the dielectric layer including at least an intermediate layer and a pair or more of fluororesin layers disposed on both sides of the intermediate layer,
    wherein the ratio of the total average thickness of the intermediate layer to the total average thickness of the fluororesin layers is 0.001 to 30,
    the relative dielectric constant of the intermediate layer is 1.2 to 10,
    the coefficient of linear expansion of the intermediate layer is $-1 \times 10^{-4}/°$ C. to $5 \times 10^{-5}/°$ C.,
    the adhesive strength between the fluororesin layer and the conductor layer is 300 g/cm or more,
    the fluororesin is crosslinked by irradiation with ionizing radiation,
    wherein the apparent relative dielectric constant of the dielectric layer is 1.2 to 2.6, and
    wherein an empty space or a foamed layer is provided, at least one of, in the fluororesin layer or the intermediate layer of the dielectric layer, and at the interface between the fluororesin layer and the intermediate layer of the dielectric layer.

2. The radio-frequency printed circuit board according to claim 1, wherein the ten-point average roughness (Rz) of the conductor layer is 4.0 μm or less.

3. The radio-frequency printed circuit board according to claim 1, wherein the fluororesin layer and the conductor layer are chemically bonded to each other.

4. The radio-frequency printed circuit board according to claim 1, wherein the adhesive strength between the fluororesin layer and the conductor layer is 600 g/cm or more.

5. The radio-frequency printed circuit board according to claim 1, wherein the fluororesin layer is chemically bonded to the intermediate layer.

6. The radio-frequency printed circuit board according to claim 1, wherein a rustproofing layer containing a silane coupling agent is disposed on the conductor layer at the interface between the conductor layer and the dielectric layer, and the silane coupling agent and the fluororesin are chemically bonded to each other.

7. The radio-frequency printed circuit board according to claim 3,
    wherein the chemical bonding between the fluororesin layer and the conductor layer is induced by irradiation with ionizing radiation.

8. The radio-frequency printed circuit board according to claim 1,
    wherein a ratio of an average thickness of one fluororesin layer to an average thickness of another fluororesin layer is in the range of 0.9 to 1.1.

* * * * *